(12) United States Patent
Liaw

(10) Patent No.: US 11,462,614 B2
(45) Date of Patent: Oct. 4, 2022

(54) SEMICONDUCTOR DEVICES AND METHODS OF MANUFACTURING

(71) Applicant: Taiwan Semiconductor Manufacturing Company, Ltd., Hsinchu (TW)

(72) Inventor: Jhon Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 93 days.

(21) Appl. No.: 16/780,112

(22) Filed: Feb. 3, 2020

(65) Prior Publication Data

US 2021/0066452 A1 Mar. 4, 2021

Related U.S. Application Data

(60) Provisional application No. 62/894,425, filed on Aug. 30, 2019.

(51) Int. Cl.
| | |
|---|---|
| *H01L 21/768* | (2006.01) |
| *H01L 29/423* | (2006.01) |
| *H01L 29/06* | (2006.01) |
| *H01L 29/08* | (2006.01) |
| *H01L 29/10* | (2006.01) |
| *B82Y 40/00* | (2011.01) |

(52) U.S. Cl.
CPC ...... *H01L 29/0665* (2013.01); *H01L 29/0847* (2013.01); *H01L 29/1041* (2013.01); *B82Y 40/00* (2013.01)

(58) Field of Classification Search
CPC ......... H01L 29/78696; H01L 21/76897; H01L 21/823807; H01L 21/823814; H01L 29/0665; H01L 29/1041; H01L 21/76804; B82Y 40/00
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Caridad Everhart
(74) *Attorney, Agent, or Firm* — Slater Matsil, LLP

(57) ABSTRACT

Semiconductor devices and their manufacturing methods are disclosed herein, and more particularly to semiconductor devices including a transistor having gate all around (GAA) transistor structures and manufacturing methods thereof. Different thickness in an epi-growth scheme is adopted to create different sheet thicknesses within the same device channel regions for use in manufacturing vertically stacked nanostructure (e.g., nanosheet, nanowire, or the like) GAA devices. A vertically stacked nanostructure GAA device may be formed with a topmost channel region that is thinner than a bottommost channel region. Furthermore, the topmost channel region of the GAA device may be formed with lightly doped drain regions with a highest concentration and/or a greater degree of lateral diffusion of implanted dopants as compared to the bottommost channel region.

20 Claims, 17 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,424,639 B1* | 9/2019 | Miao .................. H01L 29/66742 |
| 2010/0038698 A1* | 2/2010 | Lee .................... H01L 27/11568 |
| | | 257/324 |
| 2017/0018462 A1* | 1/2017 | Suk ..................... H01L 27/1211 |
| 2020/0273857 A1* | 8/2020 | Li ..................... H01L 21/823814 |
| 2021/0020446 A1* | 1/2021 | Sieg ................. H01L 21/823431 |

* cited by examiner

SEMICONDUCTOR DEVICES AND METHODS OF MANUFACTURING

PRIORITY CLAIM AND CROSS-REFERENCE

This application claims the benefit of U.S. Provisional Application No. 62/894,425, filed on Aug. 30, 2019, entitled "Semiconductor Devices and Methods of Manufacturing," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
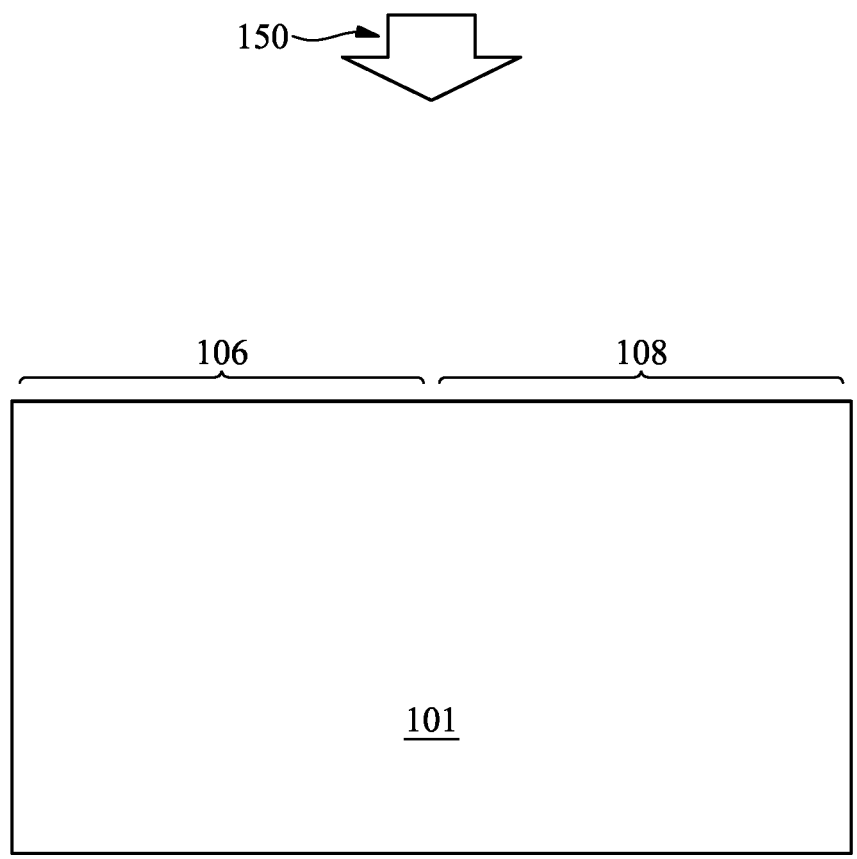
FIGS. 1-11 illustrate intermediate steps in the formation of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to the integration of horizontal gate-all-around nanostructure transistors for use in the design and operation of integrated circuits in the 5 nm technology node and below. Such embodiments allow for a top channel (e.g., channel closest to a gate top or closest to a gate contact) to face extra source/drain dopant implant induced short channel effects. For example, a thinner sheet can provide better gate control to minimize or prevent the lateral diffusion induced short channel effects of a source/drain dopant implant during fabrication of gate all-around (GAA) transistors. Embodiments, however, may be utilized in a wide variety of ways, and are not intended to be limited to the embodiments described herein.

With reference now to FIG. 1, there is illustrated a substrate 101 into which dopants have been implanted in order to form wells. In an embodiment the substrate 101 is a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). Substrate 101 may be doped or un-doped. In some embodiments, substrate 101 may be a bulk semiconductor substrate, such as a bulk silicon substrate that is a wafer, a semiconductor-on-insulator (SOI) substrate, a multi-layered or gradient substrate, or the like.

FIG. 1 further illustrates that the substrate 101 comprises a first device region 106 for forming n-type devices, such as NMOS transistors (e.g., n-type gate all around transistors) and a second device region 108 for forming p-type devices, such as PMOS transistors (e.g., p-type gate all around transistors). To separate the first device region 106 and the second device region 108, wells (not separately illustrated in FIG. 1) may be formed within the substrate 101 with n-type dopants and p-type dopants. To form the desired wells, the n-type dopants and the p-type dopants are implanted into the substrate 101 depending upon the devices that are desired to be formed. For example, n-type dopants such as phosphorous or arsenic may be implanted to form n-type wells, while p-type dopants such as boron may be implanted to form p-type wells. The n-type wells and p-type wells may be formed using one or more implantation techniques such as diffusion implantations, ion implantations (e.g., plasma doping, beam line implant doping), selective implantations, deep-well implantations, and the like, or combinations thereof. Masking techniques may also be utilized to mask some regions (e.g., second device region 108) of the substrate 101 while exposing other regions (e.g., first device region 106) of the substrate 101 during a first well implantation (e.g., n-type wells) process.

Once the first well implantation process has been completed, the mask is removed to expose the previously masked regions (e.g., second device region 108) and another mask may be placed over the previously exposed regions (e.g., first device region 106) during a second well implantation (e.g., p-type wells) process. In some embodiments, further doping implantations may be performed to form deep well implant regions within the substrate 101.

According to some embodiments, an optional anti-punch through (APT) (e.g., optional APT implantation process 150 represented by the directional arrow in FIG. 1) may be performed in order to implant anti-punch through dopants into the substrate 101. The anti-punch through dopants help to reduce or prevent the short channel effect of electrons or holes punching through from the source to the drain. The anti-punch through dopants in the first device region 106 may be doped the same as the well in the first device region 106 but with a higher dopant concentration and the anti-punch through region in the second device region 108 may be doped (in, e.g., a separate process) the same as the well in the second device region 108 but with a higher dopant concentration. Furthermore, the optional APT implantation process 150 may comprise a series of implant steps (e.g., Well-1, Well-2, and APT). According to some embodiments each implant step uses an implantation dosage into the substrate 101 with a concentration of between about 1E13/cm$^2$ and about 1.5E14/cm$^2$. However, any suitable implantation and dosage may be utilized.

Figure 2:
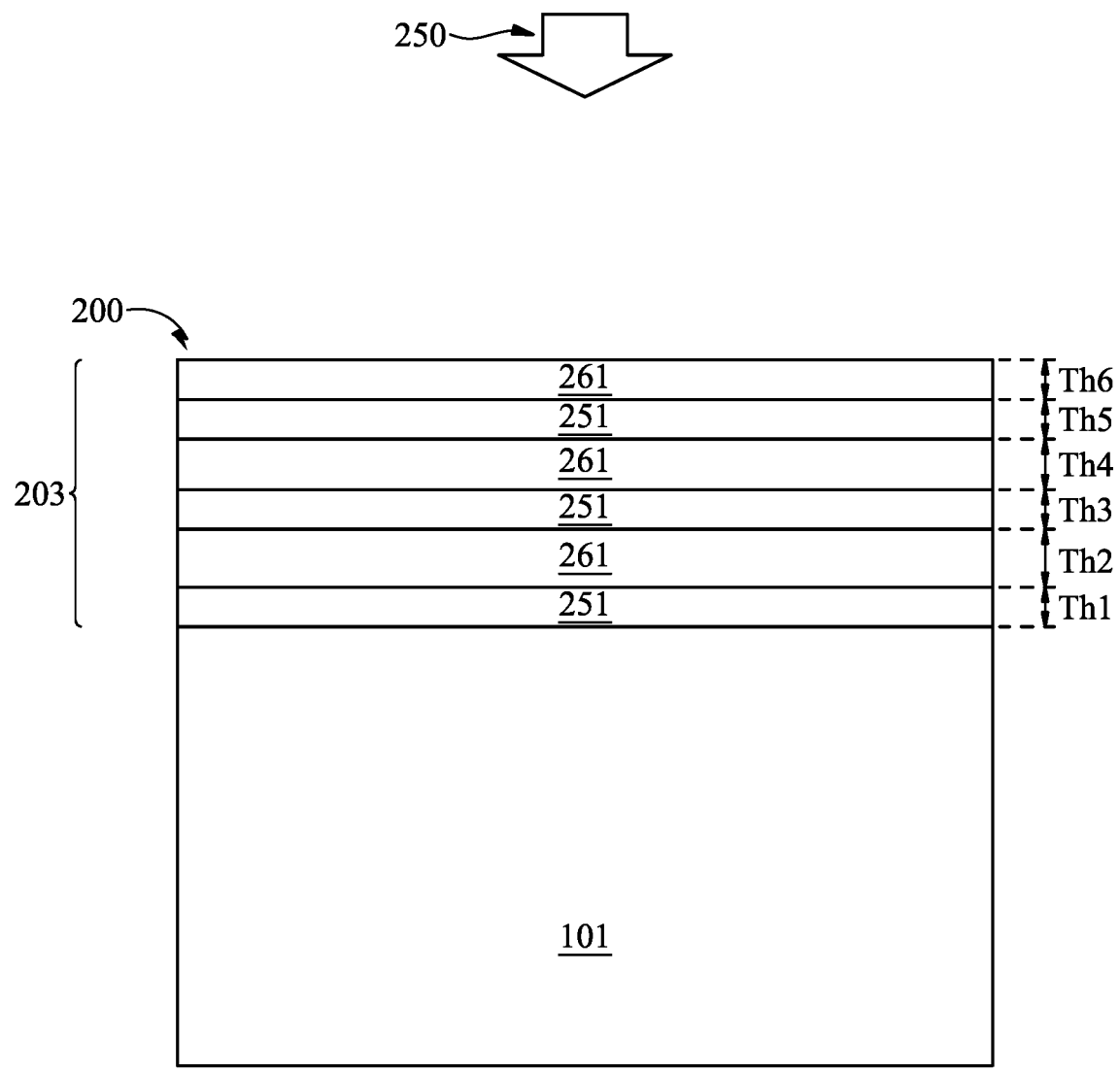

FIG. 2 is a cross-sectional view of a deposition process 250, in accordance with some embodiments, to form a multi-layer structure 200 in an intermediate stage of manufacturing the gate all-around (GAA) transistor. In particular, FIG. 2 illustrates a series of depositions that are performed to form a multi-layer stack 203 of alternating materials of first layers 251 and second layers 261 over the substrate 101.

According to some embodiments, the deposition process 250 comprises forming a first layer 251 of semiconductor material with a first lattice constant, such as SiGe, Ge, Si, GaAs, InSb, GaSb, InAlAs, InGaAs, GaSbP, GaAsSb, combinations of these, or the like. In some embodiments, the first layer 251 is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layer 251 is formed to a first thickness Th1 of between about 4 nm and about 15 nm, such as about 10 nm. However, any suitable thickness may be utilized while remaining within the scope of the embodiments.

Once the first layer 251 has been formed over the substrate 101, the second layer 261 may be formed over the first layer 251. According to some embodiments, the second layer 261 may be a second semiconductor material such as Si, SiGe, Ge, GaAs, InSb, GaSb, InAlAs, InGaAs, GaSbP, GaAsSb, combinations of these, or the like, with a different lattice constant than the material of the first layer 251. In a particular embodiment in which the first layer 251 is silicon germanium, the second layer 261 is a material with a different lattice constant, such as silicon. However, any suitable combination of materials may be utilized.

In some embodiments, the second layer 261 is epitaxially grown on the first layer 251 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. The second layer 261 is formed to a second thickness Th2 of between about 4 nm and about 10 nm, such as about 7 nm. However, any suitable material and any suitable thickness may be used.

Once the second layer 261 has been formed over the first layer 251, the deposition process 250 is repeated to form the remaining material layers in the series of alternating materials of the first layers 251 and the second layers 261 until a desired topmost layer of the multi-layer stack 203 has been formed. In a particular embodiment, another first layer 251 is formed to a third thickness Th3, another second layer 261 is formed to a fourth thickness Th4, another first layer 251 is formed to a fifth thickness Th5, and another second layer 261 is formed to a sixth thickness Th6. According to the present embodiment, the topmost layer of the multi-layer stack 203 is formed as a second layer 261; however, in other embodiments, the topmost layer of the multi-layer stack 203 may be formed as a first layer 251. Additionally, although embodiments are disclosed herein comprising three first layers 251 and three second layers 261, the multi-layer stack 203 may have any suitable number of layers (e.g., nanosheets). For example, the multi-layer stack 203 may comprise multiple nanosheets in a range between 2 to 10 nanosheets. In some embodiments, the multi-layer stack 203 may comprise equal numbers of first layers 251 to second layers 261; however, in other embodiments, the number of first layers 251 may be different from the number of second layers 261.

According to some embodiments, the first layers 251 of the multi-layer stack 203 are formed to be substantially the same thickness (e.g., the first thickness Th1~the third thickness Th3~the fifth thickness Th5) and the thicknesses (e.g., the second thickness Th2, the fourth thickness Th4, the sixth thickness Th6) of the second layers 261 of the multi-layer stack 203 are formed to different thicknesses from one another. FIG. 2, in accordance with some embodiments, further illustrates that a bottommost layer of the second layers 261 is the thickest of the second layers 261 and a topmost layer of the second layers 261 is the thinnest of the second layers 261 (e.g., the second thickness Th2>the fourth thickness Th4>the sixth thickness Th6).

For example, in an embodiment in which the first layers 251 are silicon germanium and the second layers 261 are silicon, the first layers 251 are formed to about the same thickness (e.g., the first thickness Th1~the third thickness Th3~the fifth thickness Th5) and the bottommost layer of the second layers 261 is formed to the second thickness Th2, which is between about 1.05 times to about 1.3 times thicker than the thickness of the topmost layer of the second layers 261 (e.g., the sixth thickness Th6). For example, each of the thicknesses (e.g., the first thickness Th1, the third thickness Th3, and the fifth thickness Th5) of the first layers 251 of the multi-layer stack 203 may be about the same thickness between about 4 nm and about 15 nm, such as about 10 nm, in accordance with some embodiments. In a particular embodiment, the first thickness Th1 may be between about 4 and about 15, such as about 10, the second thickness Th2 may be between about 4 and about 10, such as about 7, and the third thickness Th3 may be between about 4 and about 15, such as about 10. Continuing with the example, each of the second layers 261 are formed to a thickness of between about 4 nm and about 10 nm, such as about 7 nm, wherein the thickness of bottommost layer of the second layers 261

(e.g., Th2) is between about 1.05 times to about 1.3 times the thickness of the topmost layer of the second layers 261 (e.g., Th6), in accordance with some embodiments.

Additionally, as described above, the well implantations and optional APT implantation process 150 may be performed prior to the epitaxial formation of the multi-layer stack 203, according to some embodiments. In other embodiments, the epitaxial formation of the multi-layer stack 203 is formed prior to performing the well implantations and the optional APT implantation process 150. Any suitable combination of processes may be utilized to form the multi-layer stack 203 and perform the well implantations and the optional APT implantation process 150 may be used, and all such combinations are fully intended to be included within the scope of the embodiments.

Figure 3:
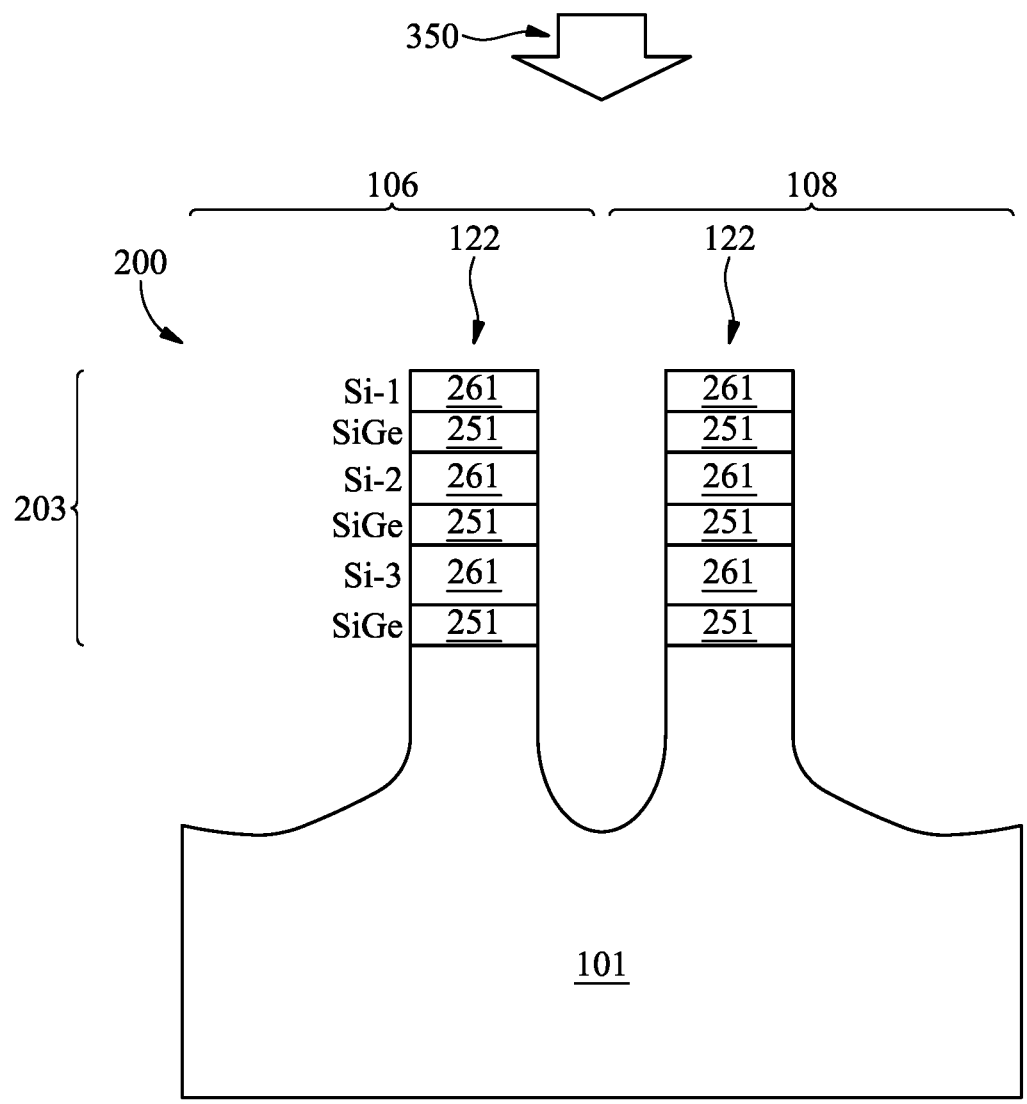

With reference now to FIG. 3, there is illustrated a patterning process 350 of the multi-layer structure 200 in an intermediate stage of manufacturing Gate All-Around (GAA) transistors, in accordance with some embodiments. In an embodiment the multi-layer stack 203 is formed from semiconductor materials that can work with the substrate 101 to help form nanostructures (e.g., nanosheets, nanowires, or the like) for the Gate All-Around (GAA) transistors. The patterning process 350, according to some embodiments, comprises applying a photoresist over the multi-layer stack 203 and then patterning and developing the photoresist to form a mask over the multi-layer stack 203. Once formed, the mask is then used during an etching process, such as an anisotropic etching process to transfer the pattern of the mask into the underlying layers and form the fins 122 in the multi-layer structure 200.

Additionally, while a single mask process has been described, this is intended to be illustrative and is not intended to be limiting, as the gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 4:
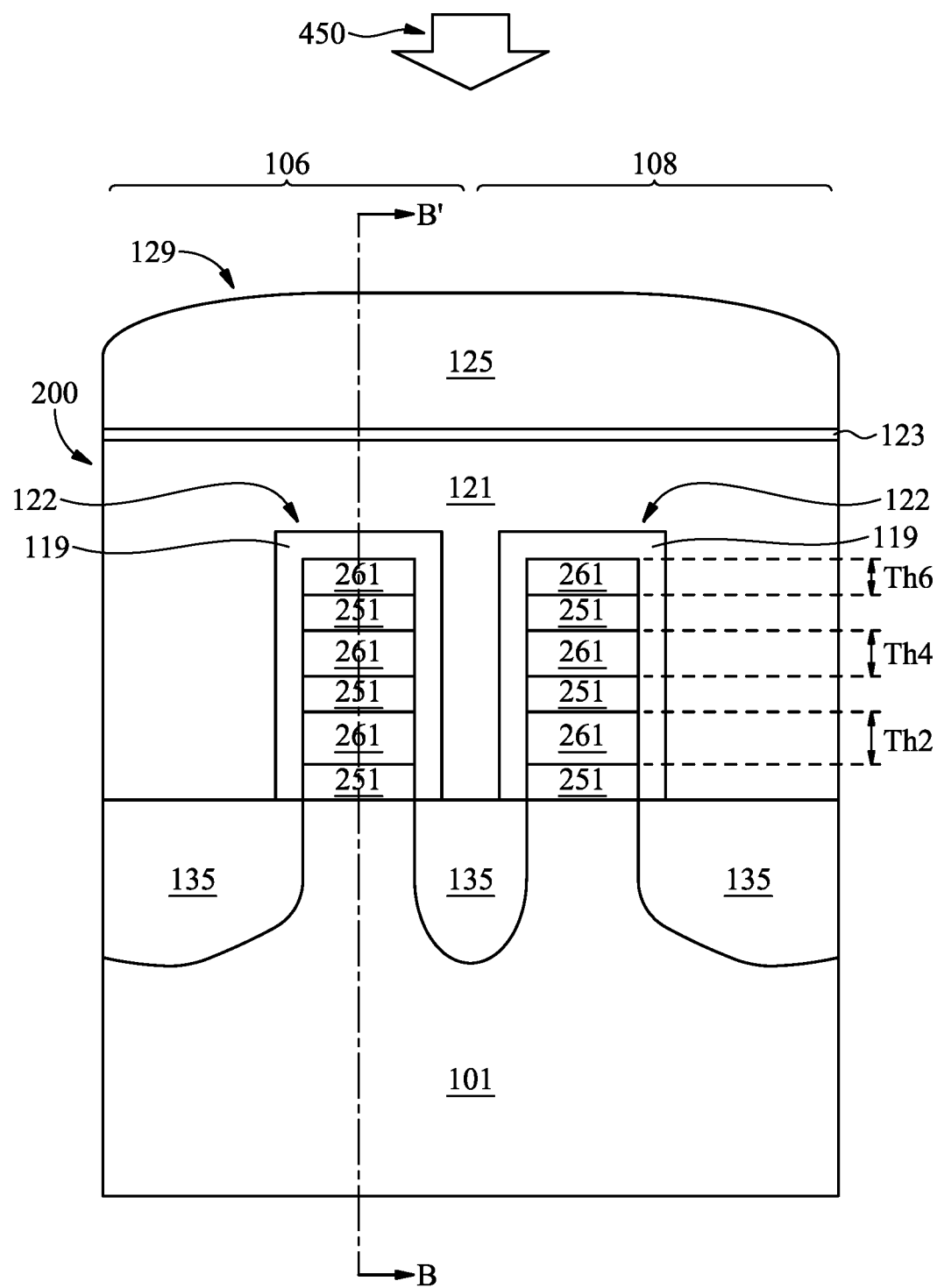

Turning to FIG. 4, after the formation of the fins 122, first isolation regions 135 are formed. In an embodiment the first isolation regions 135 may be shallow trench isolation regions formed by depositing a dielectric material such as an oxide material (e.g., a flowable oxide), high-density plasma (HDP) oxide, or the like. The dielectric material may be formed, after an optional cleaning and lining, using either a chemical vapor deposition (CVD) method (e.g., the HARP process), a high density plasma CVD method, or other suitable method of formation to fill or overfill the regions around the fins 122.

According to some embodiments, in which a flowable oxide is utilized as the dielectric material of the first isolation regions 135, a post placement anneal process 450 (e.g., oxide densification process) is performed on the multi-layer structure 200 to densify the oxide material of the first isolation regions 135 and to reduce its wet etch rate. In an embodiment, the post placement anneal process 450 may comprise one or more anneal processes (e.g., steam anneal, dry thermal anneal, diffusion-less anneal, diffusion anneal, or the like) can be performed in a furnace or in a rapid thermal processing (RTP) chamber. According to some embodiments, the post placement anneal process 450 comprises a steam anneal using steam ($H_2O$) or ($H_2O_2$) as an oxygen source at a process temperature in a range from about 500° C. to about 600° C. for a duration of between about 30 minutes and an hour. In another embodiment, the post placement anneal process 450 comprises a dry ("without steam") thermal anneal in which no steam is introduced and is performed as a low temperature dry thermal anneal using temperatures below about 750° C. In yet another embodiments, the dry thermal anneal is performed using an inert gas (e.g., $N_2$). According to some embodiments, the post placement anneal process 450 comprises a UV cure or a microwave anneal (MWA) process performed. However, any suitable annealing process may be utilized.

Once densified, excess dielectric material may be removed through a suitable process such as chemical mechanical polishing (CMP), an etch, a combination of these, or the like. In an embodiment, the removal process removes any dielectric material that is located over the fins 122 as well, so that the removal of the dielectric material will expose the surface of the fins 122 to further processing steps.

Once the dielectric material has been deposited, the dielectric material may then be recessed away from the surface of the fins 122. The recessing may be performed to expose at least a portion of the sidewalls of the fins 122 adjacent to the top surface of the fins 122. The dielectric material may be recessed using a wet etch by dipping the top surface of the fins 122 into an etchant selective to the material of the dielectric material, although other methods, such as a reactive ion etch, a dry etch, chemical oxide removal, or dry chemical clean may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form the dielectric material. All of the potential process steps are fully intended to be included within the scope of the present embodiment.

FIG. 4 also illustrates the formation of a dummy gate dielectric 119 and a dummy gate electrode 121 over the fins 122. In an embodiment the dummy gate dielectric 119 may be formed by thermal oxidation, chemical vapor deposition, sputtering, or any other methods known and used in the art for forming a gate dielectric. Depending on the technique of gate dielectric formation, the dummy gate dielectric 119 thickness on the top may be different from the dummy dielectric thickness on the sidewall.

The dummy gate dielectric 119 may comprise a material such as silicon dioxide or silicon oxynitride with a thickness ranging from about 3 angstroms to about 100 angstroms, such as about 10 angstroms. In an embodiment the dummy gate dielectric 119 may be formed by first depositing a sacrificial layer of a material such as silicon in order to provide sidewall protection. Once the sacrificial layer has been formed the sacrificial material may be oxidized or nitridized and consumed in order to form a dielectric such as the silicon dioxide or silicon oxynitride. However, any suitable process may be utilized.

In other embodiments the dummy gate dielectric 119 may also be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 119.

The dummy gate electrode 121 may comprise a conductive material and may be selected from a group comprising of polysilicon, W, Al, Cu, AlCu, W, Ti, TiAN, TaC, TaCN, TaSiN, Mn, Zr, TiN, Ta, TaN, Co, Ni, combinations of these, or the like. The dummy gate electrode 121 may be deposited by chemical vapor deposition (CVD), sputter deposition, or other techniques known and used in the art for depositing conductive materials. The thickness of the dummy gate electrode 121 may be in the range of about 5 Å to about 500 Å. The top surface of the dummy gate electrode 121 may have a non-planar top surface, and may be planarized prior to patterning of the dummy gate electrode 121 or gate etch. Ions may or may not be introduced into the dummy gate electrode 121 at this point. Ions may be introduced, for example, by ion implantation techniques.

Once the dummy gate dielectric 119 and the dummy gate electrode 121 have been formed, the dummy gate dielectric 119 and the dummy gate electrode 121 may be patterned. In an embodiment the patterning may be performed by initially forming a first hard mask 123 and a second hard mask 125 over the first hard mask 123. The first hard mask 123 comprises a dielectric material such as silicon oxide, silicon nitride, titanium nitride, silicon oxynitride, combinations of these, or the like. The first hard mask 123 may be formed using a process such as chemical vapor deposition, plasma enhanced chemical vapor deposition, atomic layer deposition, or the like. However, any other suitable material and method of formation may be utilized. The first hard mask 123 may be formed to a thickness of between about 20 Å and about 3000 Å, such as about 20 Å.

The second hard mask 125 comprises a separate dielectric material such as silicon nitride, silicon oxide, titanium nitride, silicon oxynitride, combinations of these, or the like. The second hard mask 125 may be formed using a process such as chemical vapor deposition, plasma enhanced chemical vapor deposition, atomic layer deposition, or the like. However, any other suitable material and method of formation may be utilized. The second hard mask 125 may be formed to a thickness of between about 20 Å and about 3000 Å, such as about 20 Å.

Once the first hard mask 123 and the second hard mask 125 have been formed, the first hard mask 123 and the second hard mask 125 may be patterned. In an embodiment the first hard mask 123 and the second hard mask 125 may be patterned by initially placing a photoresist (not individually illustrated) over the first hard mask 123 and the second hard mask 125 and exposing the photoresist to a patterned energy source (e.g., light) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the photoresist has been patterned, the photoresist may be used as a mask in order to pattern the underlying first hard mask 123 and the second hard mask 125. In an embodiment the first hard mask 123 and the second hard mask 125 may be patterned using, e.g., one or more reactive ion etching (RIE) processes with the photoresist as a mask. The patterning process may be continued until the dummy gate electrode 121 is exposed beneath the first hard mask 123.

Once the first hard mask 123 and the second hard mask 125 have been patterned, the photoresist may be removed from the first hard mask 123 and the second hard mask 125. In an embodiment the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Once the first hard mask 123 and the second hard mask 125 have been patterned, the dummy gate electrode 121 and the dummy gate dielectric 119 may be patterned in order to form a series of stacks 129. In an embodiment the dummy gate electrode 121 and the dummy gate dielectric 119 are patterned using an anisotropic etching process, such as a reactive ion etch, although any suitable process may be utilized.

Figure 5:
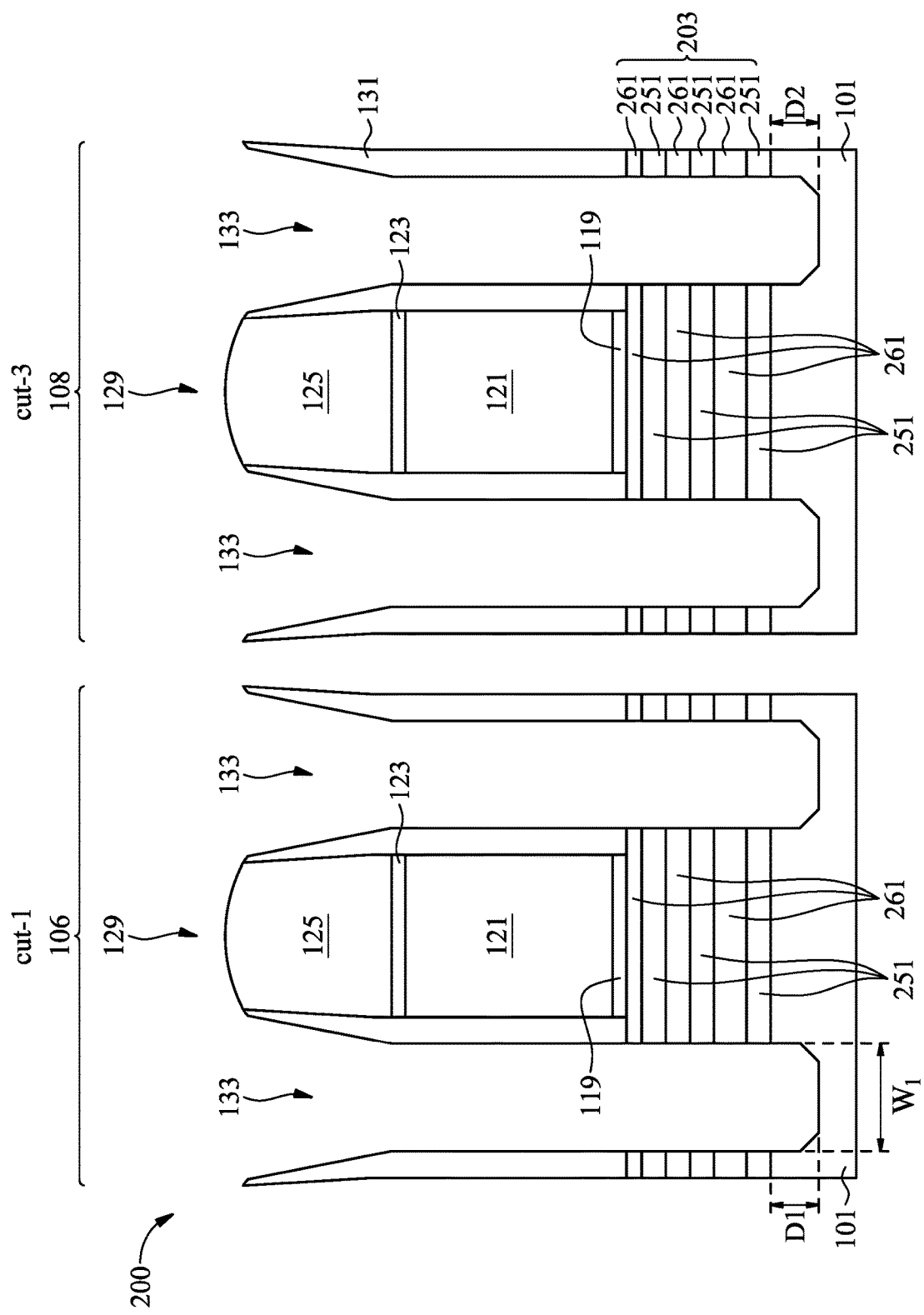

Turning to FIG. 5, this figure illustrates the cross-sectional view of the multi-layer structure 200 as taken through line B-B' of FIG. 4, in accordance with some embodiments. Additionally, while the line B-B' crosses through the first device region 106 (and, as such, the first device region 106 is illustrated in FIG. 5) for clarity a cross-sectional view of the second device region 108 is also illustrated, although the second device region 108 has been separated from the first device region 106 in FIG. 5.

FIG. 5 also illustrates the formation of first spacers 131 (e.g., top spacers). According to an embodiment, a first spacer dielectric layer may be formed over the dummy gate electrode 121 and the dummy gate dielectric 119. The first spacer dielectric layer may be formed on opposing sides of the stacks 129. The first spacer dielectric layer may be formed by blanket deposition on the multi-layer structure 200. The first spacer dielectric layer may comprise silicon oxide ($SiO_2$), silicon oxynitride (SiON), silicon nitride ($Si_3N_4$), silicon oxycarbide (SiOC), silicon oxycarbonitride (SiOCN), although any suitable material, such as low-k materials with a k-value less than about 4.0, or even an air gap, or combination thereof may be utilized. The first spacers 131 may be formed by methods utilized to form such a layer, such as chemical vapor deposition (CVD), plasma enhanced CVD, sputter, and any other suitable methods.

Once formed, the first spacer dielectric layer may be etched in order to form first spacers 131 on the stacks 129. In an embodiment the first spacers 131 may be formed using an anisotropic etching process such as a reactive ion etching (RIE) process. However, while the first spacers 131 are described using a single first spacer dielectric layer, this is intended to be illustrative and is not intended to be limiting. Rather, any number of layers and any combinations of deposition and removal processes may be used, and all such processes are fully intended to be included within the scope of the embodiments.

Additionally, during the formation of the first spacers 131, the multi-layer stack 203 will be re-exposed by the removal of the first spacer dielectric layer. Once exposed, FIG. 5 additionally illustrates an etching process to remove material from the multi-layer stack 203 and the substrate to form openings 133 which extend through the multi-layer stack 203 and into the substrate 101 in preparation for forming source/drain regions (described further below with respect to FIG. 7A). In an embodiment the etching may be performed using one or more anisotropic etches, such as reactive ion etches, although any suitable processes may be utilized.

In an embodiment the openings 133 may be formed to have a first width W1 of between about 10 nm and about 40 nm, such as about 20 nm. Additionally, the openings 133 may be formed to extend into the substrate 101 a first depth D1 of between about 2 nm and about 30 nm, such as about 10 nm. However, any suitable dimensions may be utilized.

Furthermore, in some embodiments, the openings 133 formed in the second device region 108 may be patterned separately and different from the openings 133 formed in the first device region 106. As such, the openings 133 patterned in the second device region 108 may be formed to a different width and/or a different height than the openings 133 patterned in the first source/drain regions 601. For example, in some embodiments, the openings 133 patterned in the second device region 108 may be formed to a greater width or to a lesser width than the openings 133 patterned in the first device region 106 (e.g., W1) and/or may be formed to extend into the substrate 101 to a greater extent or to a lesser extent than the openings 133 patterned in the first device region 106 (e.g., D1). However, any suitable heights and/or suitable depths may be used to form the openings 133 in the second device region 108 and all such processes are fully intended to be included within the scope of the embodiments.

Figure 6:
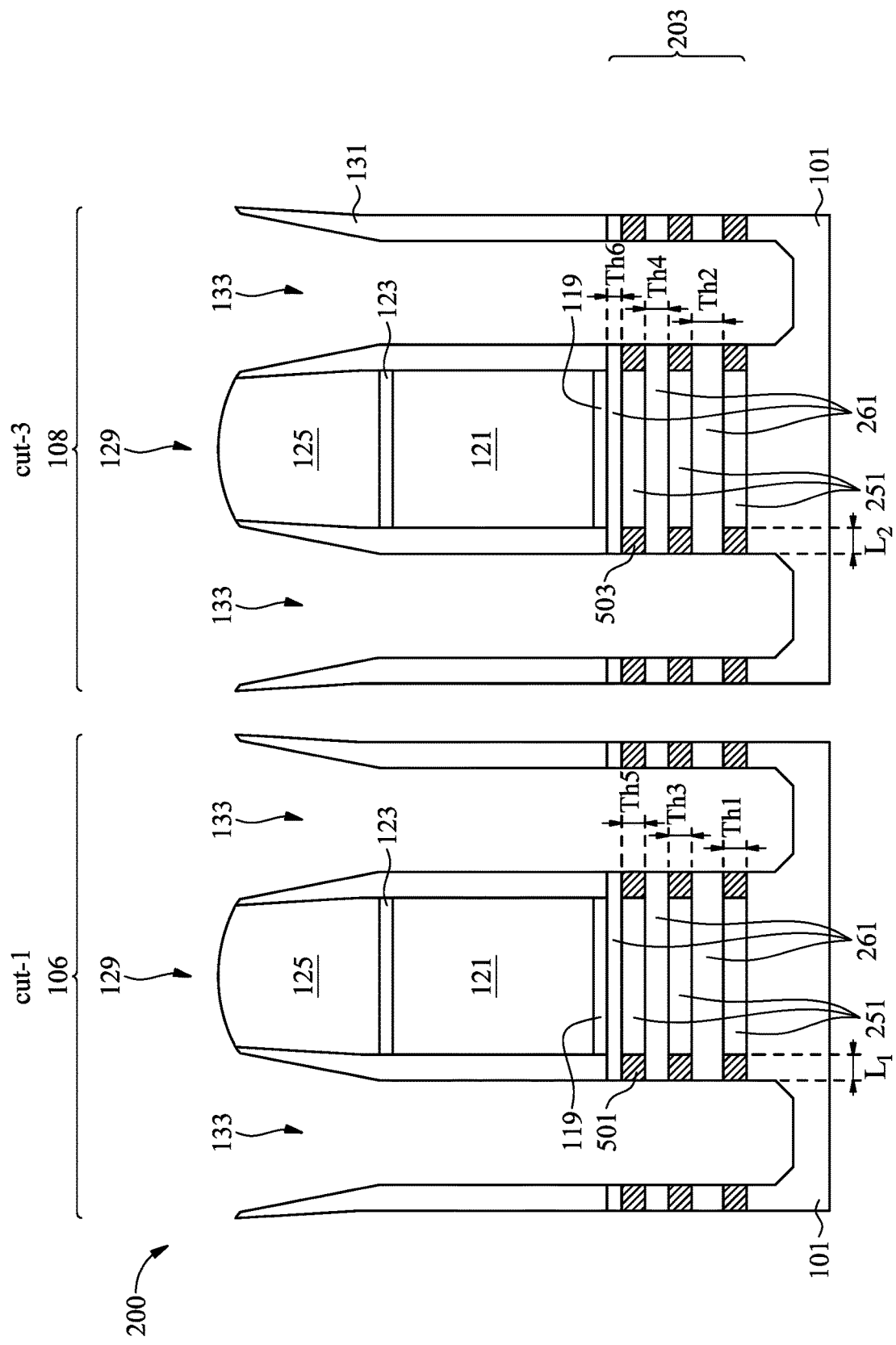

FIG. 6 illustrates formation of first inner spacers 501 in the first layers 251 of the first device region 106 and formation of second inner spacers 503 in the first layers 251 of the second device region 108. The first inner spacers 501 may be formed in the first layers 251 of the first device region 106 and the second inner spacers 503 may be formed in the first layers 251 of the second device region 108 during a same series of steps or they may be formed in different series of steps while masking one of the device regions.

In some embodiments, the first inner spacers 501 and the second inner spacers 503 are formed by patterning recesses using a wet etch with an etchant selective to the material of the first layers 251 (e.g., silicon germanium (SiGe)) without significantly removing the material of the second layers 261 (e.g., silicon) or the substrate 101 (e.g., Si). For example, in an embodiment in which the first layers 251 are silicon germanium and the second layers 261 are silicon, the wet etch may use an etchant such as hydrochloric acid (HCl).

In an embodiment the wet etching process may be a dip process, a spray process, a spin-on process, or the like. Additionally, the wet etching process may be performed at a temperature of between about 400° C. and about 600° C. and may be continued for a time of between about 100 seconds and about 1000 seconds, such as about 300 seconds. However, any suitable process conditions and parameters may be utilized. The etching process may be continued such that recesses with facet limited surfaces are formed in each of the first layers 251 to a length of between about 4 nm and about 8 nm, such as about 6 nm. However, any suitable length may be used.

In embodiments in which the first layers 251 of the first device region 106 are patterned separately from the first layers 251 of the second device region 108, the recesses formed in the first device region 106 may be patterned differently from the recesses formed in the second device region 108. For example, the recesses formed in the first device region 106 may be formed to a first length L1 and the recesses formed in the second device region 108 may be formed to a second length L2. The second length L2 may be the same or different from the first length L1 and/or the second facet limited surfaces may be the same or different from the first facet limited surfaces and all such processes are fully intended to be included within the scope of the embodiments.

However, a wet etching process is not the only process that may be utilized. For example, in another embodiment the patterning of the first layers 251 may be performed with a isotropic dry etching process or a combination of a dry etching process and a wet etching process. Any suitable process of patterning the first layers 251 may be utilized, and all such processes are fully intended to be included within the scope of the embodiments.

Once the recesses are formed in each of the first layers 251 in the first device region 106 and in each of the first layers 251 of the second device region 108, a spacer material is formed over both the first device region 106 and the second device region 108. In some embodiments, the spacer material can be different from the material of the first spacers 131 and can be a dielectric material comprising silicon such as silicon oxide ($SiO_2$), silicon oxynitride (SiON), silicon nitride ($Si_3N_4$), silicon oxycarbide (SiOC), silicon oxycarbonitride (SiOCN), although any suitable material such as low-k materials with a k-value less than about 4.0, or even an air gap, or combination thereof may also be utilized. The spacer material may be deposited using a deposition process such as chemical vapor deposition, physical vapor deposition, or atomic layer deposition to a thickness of between about 3 nm and about 10 nm, such as about 5 nm. However, any suitable thickness or deposition process may be utilized.

By depositing the spacer material over both the first device region 106 and the second device region 108, the spacer material will line the sidewalls of the openings 133 and will also fill in the recesses in the first layers 251 of the first device region 106 and the recesses in the first layers 251 of the second device region 108. Once the recesses have been filled with the spacer material, a removal process is then performed to remove the spacer material from the openings 133 within the first device region 106 and the openings 133 within the second device region 108, while leaving behind first inner spacers 501 in the first device region 106 and leaving behind second inner spacers 503 in the second device region 108. In an embodiment, the removal of the spacer material may be performed using an etching process such as, e.g., an anisotropic, dry etching process such as a reactive ion etching process. However, any suitable etching process, which removes the spacer material from the openings 133 while leaving behind the first inner spacers 501 and the second inner spacers 503, may be utilized.

As such, the first inner spacers 501 will take on the shape of the first recesses and the second inner spacers 503 will take on the shape of the second recesses. Additionally, while an embodiment forming the first inner spacers 501 and the second inner spacers 503 to faceted shapes is described, this is intended to be illustrative and is not intended to be limited. Rather, any suitable shape, such as a concave shape or a convex shape, or even the first inner spacers 501 and the second inner spacers 503 being recessed may be utilized. All such shapes are fully intended to be included within the scope of the embodiments.

Figure 7A:
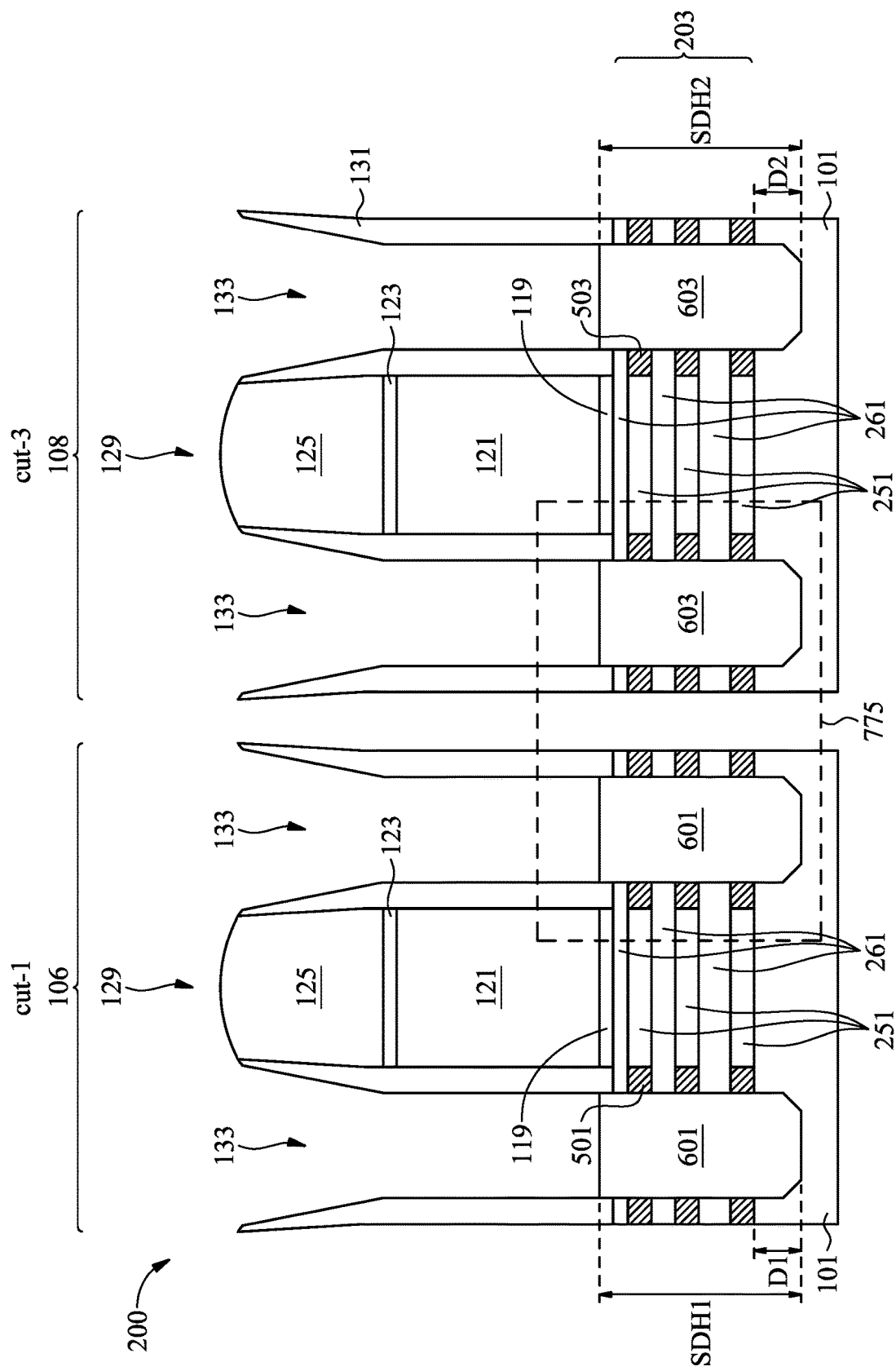

FIG. 7A illustrates formation of first source/drain regions 601 within the first device region 106 and second source/drain regions 603 within the second device region 108. In an embodiment the first source/drain regions 601 may be formed by initially protecting the second device region 108 with, for example, a photoresist or other masking materials. Once the second device region 108 has been protected, the first source/drain regions 601 may be formed using a growth process such as a selective epitaxial process with a semiconductor material suitable for the device desired to be formed. For example, in an embodiment in which the first source/drain regions 601 are utilized to form an NMOS device, the first source/drain regions 601 may be a semiconductor material such as silicon, silicon phosphorous, silicon carbon phosphorous, combinations, of these, or the like. The epitaxial growth process may use precursors such as silane, dichlorosilane, germane, and the like, and may continue for between about 5 minutes and about 120 minutes, such as about 30 minutes. According to some embodiments, the first source/drain regions 601 are formed to a first source/drain height SDH1 of between about 30 nm and about 90 nm, such as about 60 nm and extend into the substrate 101 the first depth D1. However, any suitable heights and/or suitable depths may be used.

Once the first source/drain regions 601 are formed, dopants may be implanted into the first source/drain regions 601 by implanting appropriate dopants to complement the dopants within the remainder of the first device region 106. For example, n-type dopants such as phosphorous (P), carbon (C), arsenic (As), silicon (Si), antimony (Sb), or the like, and combinations thereof (e.g., SiP, SiC, SiPC, SiAs, Si, Sb, etc.) may be implanted to form NMOSFET devices. These dopants may be implanted using the stacks 129 and the first spacers 131 as masks.

In another embodiment, the dopants of the first source/drain regions 601 may be placed during the growth of the first source/drain regions 601. For example, phosphorous may be placed in situ as the first source/drain regions 601 are being formed. Any suitable process for placing the dopants within the first source/drain regions 601 may be utilized, and all such processes are fully intended to be included within the scope of the embodiments.

Once the first source/drain regions 601 have been formed, the second source/drain regions 603 may be formed by removing the protection from the second device region 108 (through, e.g., a process such as ashing) and protecting the first device region 106 with, for example, a photoresist or other masking material. Once the first device region 106 has been protected, the second source/drain regions 603 may be formed of materials comprising silicon (Si), silicon germanium (SiGe), silicon germanium carbon (SiGeC), germanium (Ge), or combinations thereof. The second source/drain regions 603 may be formed using a process such as epitaxial growth, although any suitable material or process may be utilized.

FIG. 7A further illustrates that the second source/drain regions 603 are formed to a second source/drain height (e.g., SDH2) and a second depth (e.g., D2). The second source/drain regions 603 may be formed to a same height and/or a same depth as the first source/drain regions 601, although the heights and/or depths may be different from those of the first source/drain regions 601 and all such processes are fully intended to be included within the scope of the embodiments. According to some embodiments, the second source/drain regions 603 are formed to a second source/drain height SDH2 of between about 30 nm and about 90 nm, such as about 60 nm and extend into the substrate 101 a second depth D2 of between about 3 nm and about 40 nm. However, any suitable heights and/or suitable depths may be used.

Additionally, either during the growth process or after the growth process, dopants may be implanted within the second source/drain regions 603 by implanting appropriate dopants to complement the dopants within the remainder of the second device region 108. For example, p-type dopants such as boron may be may be implanted to form PMOSFET devices in the second device region 108. These dopants may be implanted using the stacks 129 and the first spacers 131 as masks. For example, the dopants may be implanted after formation using an ion implantation process, or else may be deposited in situ with the formation of the second source/drain regions 603. Additionally, once the second source/drain regions 603 have been formed, the protection of the first device region 106 may be removed using a process such as ashing.

Figure 7B:
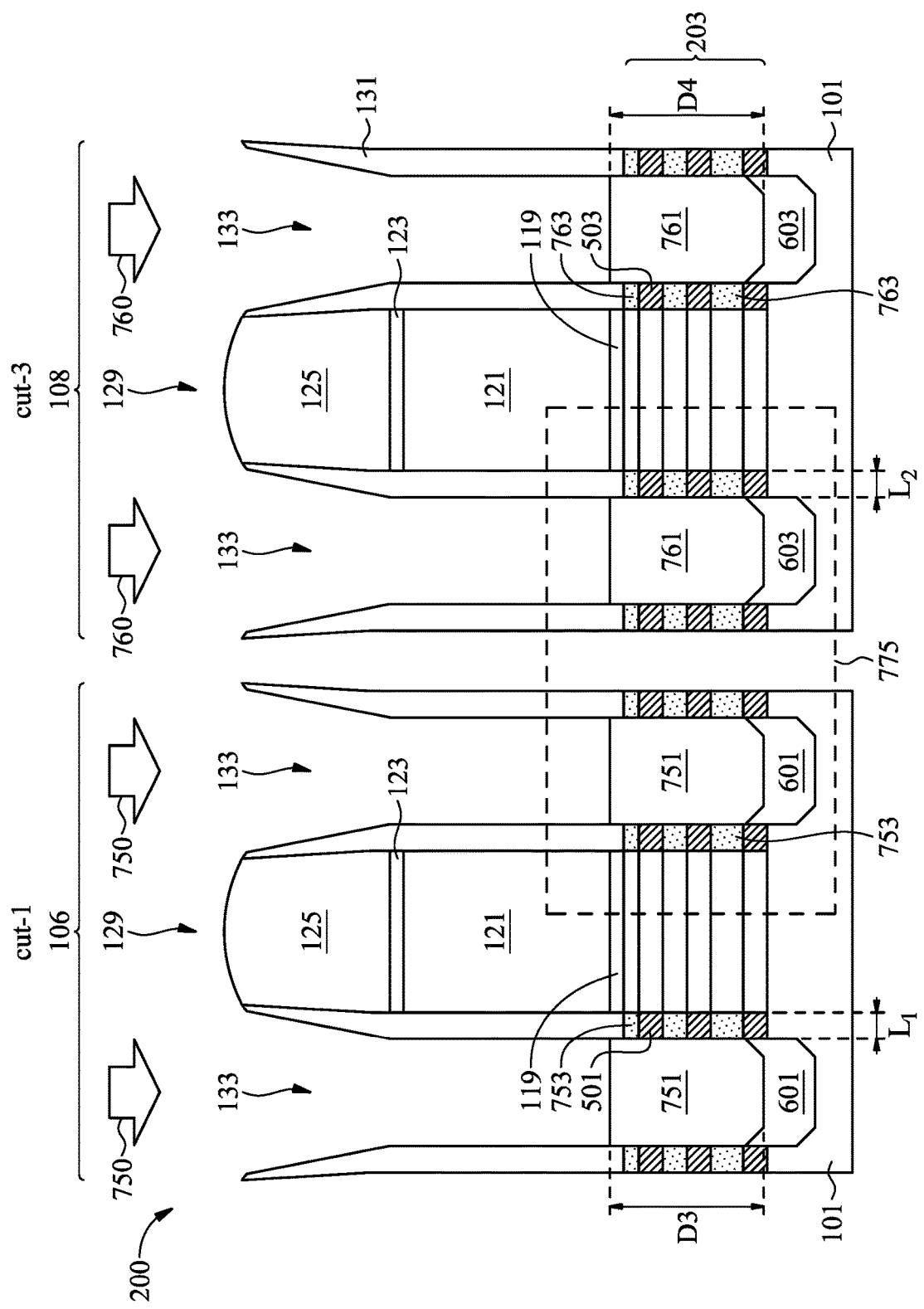

FIG. 7B illustrates, according to some particular embodiments, optional high energy dopant implantation processes for deep and/or high concentration implantations of dopants in the source/drain regions. The optional high energy dopant implantation process may be performed in the first device region 106 and/or in the second device region 108 based on a desired dopant species to be implanted during the formation of a desired device structure (e.g., NMOSFET, PMOSFET, or the like), according to some embodiments.

In some particular embodiments, the optional high energy dopant implantation process comprises a first dopant implantation 750 which may be performed to implant a first dopant species 751 in the first source/drain regions 601 to a third depth D3. In some embodiments, the first dopant species 751 is an n-type dopant such as phosphorous (Ph), arsenic (As), and the like, or combinations thereof may be implanted to form, e.g., NMOSFET devices. Furthermore, the high energy implantation is performed at a first energy level of between about 5 Kev to about 50 Kev, such as about 20 Kev using a first implant angle (from vertical) of between about 83 degrees and about 97 degrees, such as about 90 degrees, in accordance with some embodiments. As such, the first dopant species 751 is implanted in the first source/drain regions 601 to the third depth D3 of between about 10 nm and about 60 nm, such as about 25 nm and having a dopant concentration of between about 5E19 atoms/cm$^3$ to about 5E21 atoms/cm$^3$, such as about 5E20 atoms/cm$^3$.

FIG. 7B further illustrates, according to some particular embodiments, the optional high energy dopant implantation process comprises a second dopant implantation 760 which may be performed to implant a second dopant species 761 in the second source/drain regions 603 to a fourth depth D4. In some embodiments, the second dopant species 761 is an p-type dopant such as boron (B), BF2, indium (In), and the like, or combinations thereof and may be implanted to form, e.g., PMOSFET devices. Furthermore, the high energy implantation is performed at a second energy level of between about 3 Kev to about 20 Kev, such as about 8 Kev (for Boron) and between about 10 Kev to about 50 Kev, such as about 30 Kev (for BF2 or In) using a second implant angle (from vertical) of between about 83 degrees and about 97 degrees, such as about 90 degrees, in accordance with some embodiments. As such, the second dopant species 761 is implanted in the second source/drain regions 603 to the fourth depth D4 of between about 10 nm and about 60 nm, such as about 25 nm and having a dopant concentration of between about 1E19 atoms/cm$^3$ to about 1E21 atoms/cm$^3$, such as about 1E20 atoms/cm$^3$ (for Boron), and between about 1E19 atoms/cm$^3$ to about 1E21 atoms/cm$^3$, such as about 1E20 atoms/cm$^3$ (for BF2 or In), in accordance with some embodiments.

Once the dopants have been implanted within the first source/drain regions 601 and the second source/drain regions 603, an annealing process may be performed in order to activate the dopants and also to diffuse the dopants into the second layers 261 to form first lightly doped regions 753 within the first device region 106 and second lightly doped regions 763 within the second device region 108. In an embodiment the annealing process may be a thermal process such as a rapid thermal annealing (RTA) process or else a laser annealing process. In an embodiment in which the annealing process is a thermal annealing process, the annealing process may be performed at a temperature of between about 600 C and about 1200 C, such as about 950 C, for a time of between about 10-6 second and about 60 second, such as about 1 second. However, any suitable conditions may be utilized.

FIG. 7B further illustrates a highlighted section 775. The highlighted section 775 highlights a portion of the first device region 106 including the first dopant species 751 and the first lightly doped regions 753 and further highlights a portion of the second device region 108 including the second dopant species 761 and the second lightly doped regions 763.

Figure 7C:
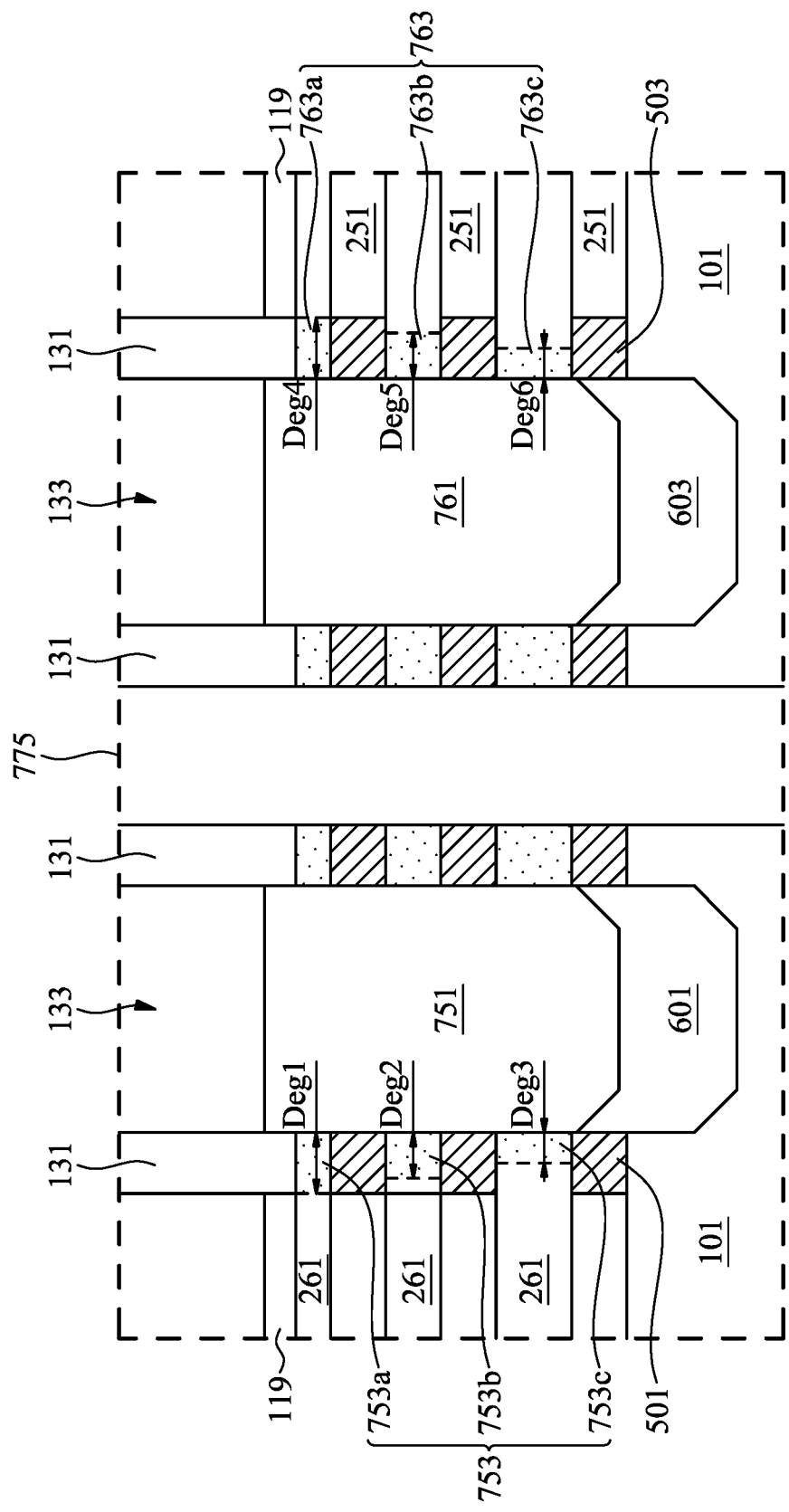

FIG. 7C is a magnified view of the highlighted section 775 and illustrates the formation of the first lightly doped regions 753, in accordance with some specific embodiments. During the first formation of the first lightly doped regions 753, the first lightly doped regions 753 may be formed with different concentration levels of the first dopant species 751 from one another and/or formed with different degrees of lateral diffusion of the first dopant species 751 from one another. However, the concentration levels and/or degrees of lateral diffusion of the first dopant species 751 may also be the same.

According to some particular embodiments, the first lightly doped regions 753 comprise a topmost region 753$a$ having a first concentration level of the first dopant species 751, an intermediate region 753$b$ having a second concentration level of the first dopant species 751, and a bottommost region 753$c$ having a third concentration level of the first dopant species 751. In some embodiments, the first concentration level of the first dopant species 751 are between about 1E19 to about 1E21, such as about 1E20, the second concentration level of the first dopant species 751 is between about 5E18 and about 5E20, such as about 5E19, and the third concentration level of the first dopant species 751 is between about 1E18 atoms/cm$^3$ to about 1E20 atoms/cm$^3$, such as about 1E19 atoms/cm$^3$. According to some embodiments, the first concentration level is greater than the second concentration level and the second concentration level is greater than the third concentration level. In some embodiments, a ratio of the first concentration level to the third concentration level of the first lightly doped regions 753 is between about 100:1 and about 3:1, such as about 10:1. In some embodiments, a ratio of the first concentration level to the second concentration level of the first lightly doped regions 753 is between about 10:1 and about 2:1, such as about 4:1.

After the first dopant implantation 750 and the subsequent annealing process, the first dopant species 751 diffuses laterally into the first lightly doped regions 753 through the interfaces between the first source/drain regions 601 and the second layers 261. Furthermore, the first inner spacers 501 prevent diffusion of the first dopant species 751 from the first source/drain regions 601 into the first layers 251. According to some embodiments, the first dopant species 751 laterally diffuses into the topmost region 753$a$ to a first degree Deg1, laterally diffuses into the intermediate region 753$b$ to a second degree Deg2, and laterally diffuses into the bottommost region 753$c$ to a third degree Deg3. In some embodiments, the first degree Deg1 of lateral diffusion of the first dopant species 751 are between about 2 nm and about 8 nm, such as about 5 nm, the second degrees Deg2 is between about 2 nm and about 6 nm, such as about 4 nm, and the third degree Deg3 is between about 1 nm and about 6 nm, such as about 2 nm. According to some embodiments, the first degree Deg1 of lateral diffusion is greater than the second degree Deg2 of lateral diffusion and the second degree Deg2 of lateral diffusion is greater than the third degree Deg3 of lateral diffusion. In some embodiments, a ratio of the first degree Deg1 of lateral diffusion of the first dopant species 751 into the topmost region 753$a$ to the third degree Deg3 of lateral diffusion into the bottommost region 753$c$ is between about 6:1 and about 1.5:1, such as about 3:1.

FIG. 7C further illustrates the formation of the second lightly doped regions 763, in accordance with some specific embodiments. During the formation of the second lightly doped regions 763, the second lightly doped regions 763 may be formed with different concentration levels of the second dopant species 761 from one another and/or formed with different degrees of lateral diffusion of the second dopant species 761 from one another similar to the diffusion of the first dopant species 751. However, the concentration levels and/or degrees of lateral diffusion of the second lightly doped regions 763 may also be the same as one another. Furthermore, according to some embodiments, the concentration levels and/or degrees of lateral diffusion of the second lightly doped regions 763 may be different from the concentration levels and/or degrees of lateral diffusion of corresponding ones of the first lightly doped regions 753; however, they may also be the same.

According to some particular embodiments, the second lightly doped regions 763 may be doped with different concentration levels of the second dopant species 761. According to some embodiments, the second lightly doped regions 763 comprise a topmost region 763$a$ having a fourth concentration level, an intermediate region 763$b$ having a fifth concentration level, and a bottommost region 763$c$ having a sixth concentration level. In some embodiments, the fourth concentration level of the second dopant species 761 is between about 2E18 atoms/cm$^3$ to about 2E20 atoms/cm$^3$, such as about 2E19 atoms/cm$^3$, the fifth concentration level of the second dopant species 761 is between about 1E18 atoms/cm$^3$ to about 1E20 atoms/cm$^3$, such as about 1E19 atoms/cm$^3$, and the sixth concentration level of the second dopant species 761 is between about 2E17 atoms/cm$^3$ to about 2E19 atoms/cm$^3$, such as about 2E18 atoms/cm$^3$. According to some embodiments, the fourth concentration level is greater than the fifth concentration level, and the fifth concentration level is greater than the sixth concentration level. In some embodiments, a ratio of the fourth concentration level to the sixth concentration level of the second lightly doped regions 763 is between about 100:1 and about 3:1, such as about 10:1.

During the second dopant implantation 760, the second dopant species 761 diffuses laterally into the second lightly doped regions 763 through the interfaces between the second source/drain regions 603 and the second layers 261. Furthermore, the second inner spacers 503 prevent diffusion of the second dopant species 761 from the second source/drain regions 603 into the first layers 251. According to some embodiments, the second dopant species 761 laterally diffuses into the topmost region 763$a$ to a fourth degree Deg4, laterally diffuses into the intermediate region 763$b$ to a fifth degree Deg5, and laterally diffuses into the bottommost region 763$c$ to a sixth degree Deg6. In some embodiments, the fourth degree Deg4, of lateral diffusion is between about 2 nm and about 8 nm, such as about 5 nm, the fifth degree Deg5 of lateral diffusion is between about 2 nm and about 6 nm, such as about 4 nm, and the sixth degree Deg6 of lateral diffusion is between about 1 nm and about 6 nm, such as about 2 nm. According to some embodiments, the fourth degree Deg4 of lateral diffusion is greater than the fifth degree Deg5 of lateral diffusion and the fifth degree Deg5 of lateral diffusion is greater than the sixth degree Deg6 of lateral diffusion. In some embodiments, a ratio of the fourth degree Deg4 of lateral diffusion of the second dopant species 761 into the topmost region 763a to the sixth degree Deg6 of lateral diffusion of the second dopant species 761 into the bottommost region 763c is between about 6:1 and about 1.5:1, such as about 3:1.

Figure 8:
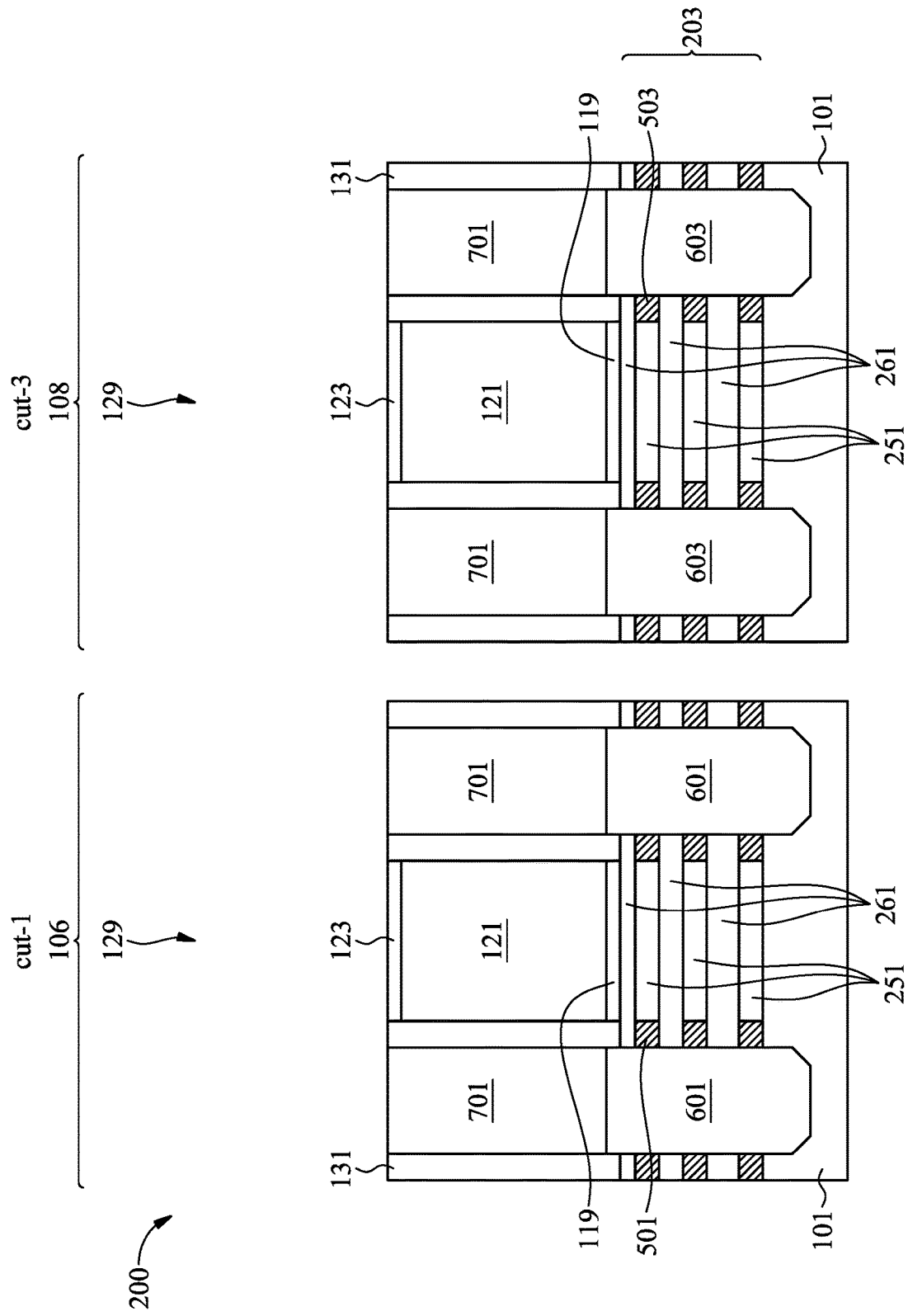

FIG. 8 illustrates a formation of a first inter-layer dielectric (ILD) (e.g., first ILD layer 701) over the first device region 106 and the second device region 108. The first ILD layer 701 may comprise a material such as silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof, although any suitable dielectrics may be used. The first ILD layer 701 may be formed using a process such as PECVD, although other processes, such as LPCVD, may alternatively be used.

Additionally, if desired, gate end dielectrics 1325 (not illustrated in FIG. 8 but illustrated below with respect to FIG. 12A) may be formed. In an embodiment, portions of the dummy gate electrode 121 are removed using, e.g., a masking and etching process in order to cut the dummy gate electrode 121 into separate sections. Once the material has been cut, material for the gate end dielectrics 1325 such as silicon nitride, silicon oxide, titanium nitride, silicon oxynitride, combinations of these, or the like, is deposited and planarized in order to form the gate end dielectrics 1325 and separate the materials of the dummy gate electrode 121.

Once the first ILD layer 701 has been deposited and any gate end dielectrics 1325 have been formed, the first ILD layer 701 and gate end dielectrics 1325 may be planarized with the first spacers 131 using, e.g., a planarization process such as a chemical mechanical polishing process, although any suitable process may be utilized. Additionally, the planarization process can also remove the second hard mask 125 while stopping on the first hard mask 123.

Figure 9:
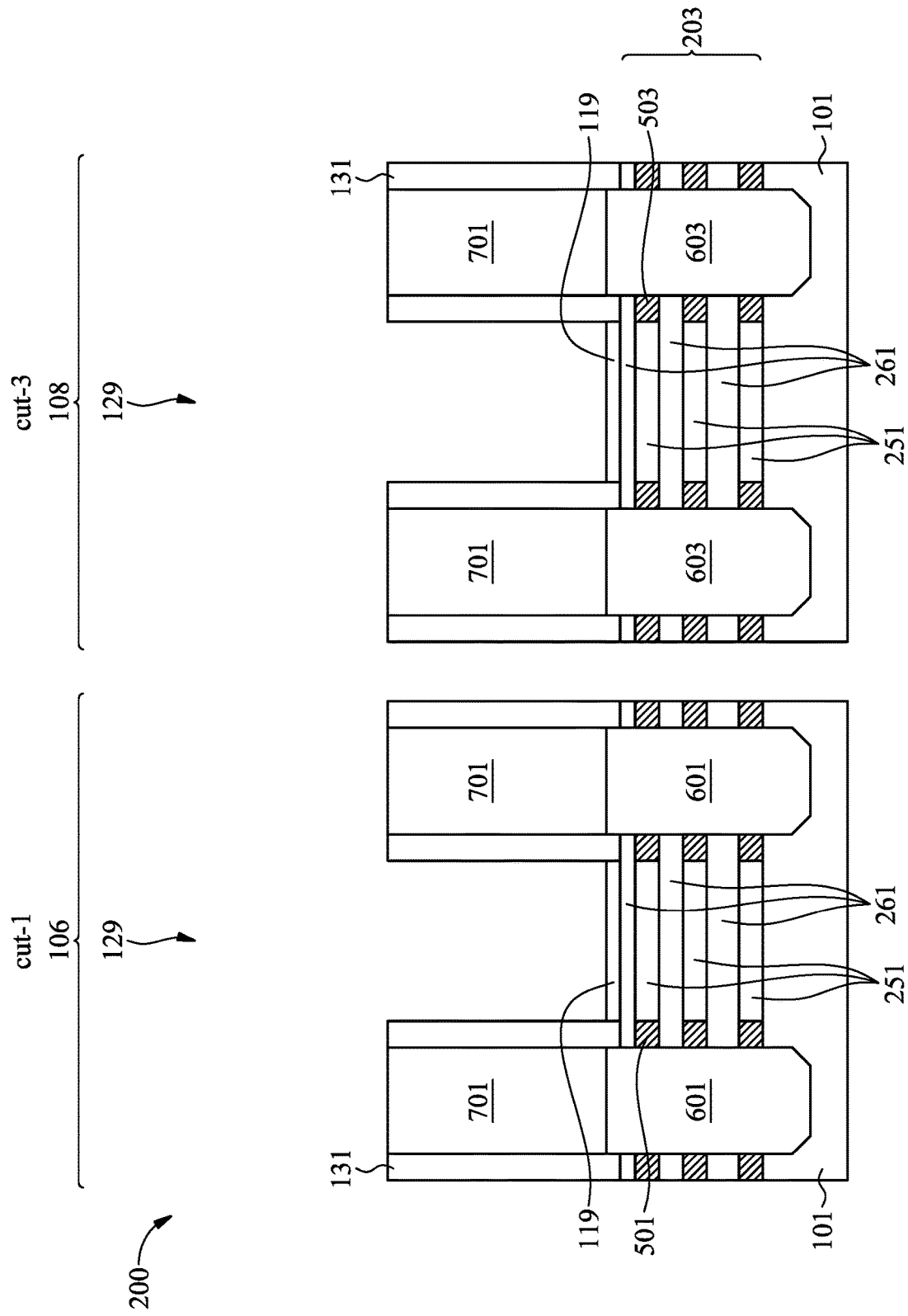

FIG. 9 illustrates a removal of the first hard mask 123 as well as a removal of the dummy gate electrode 121. In an embodiment the first hard mask 123 may be removed using an etching process or a planarization process (e.g., a continuation of the previous chemical mechanical polishing process) to remove the material of the first hard mask 123. However, any suitable method of removing the first hard mask 123 to expose the material of the dummy gate electrode 121 may be utilized.

Once the dummy gate electrode 121 has been exposed, the dummy gate electrode 121 may be removed in order to expose the underlying dummy gate dielectric 119. In an embodiment the dummy gate electrode 121 may be removed using, e.g., one or more wet or dry etching process that utilizes etchants that are selective to the material of the dummy gate electrode 121. However, any suitable removal process may be utilized.

Figure 10A:
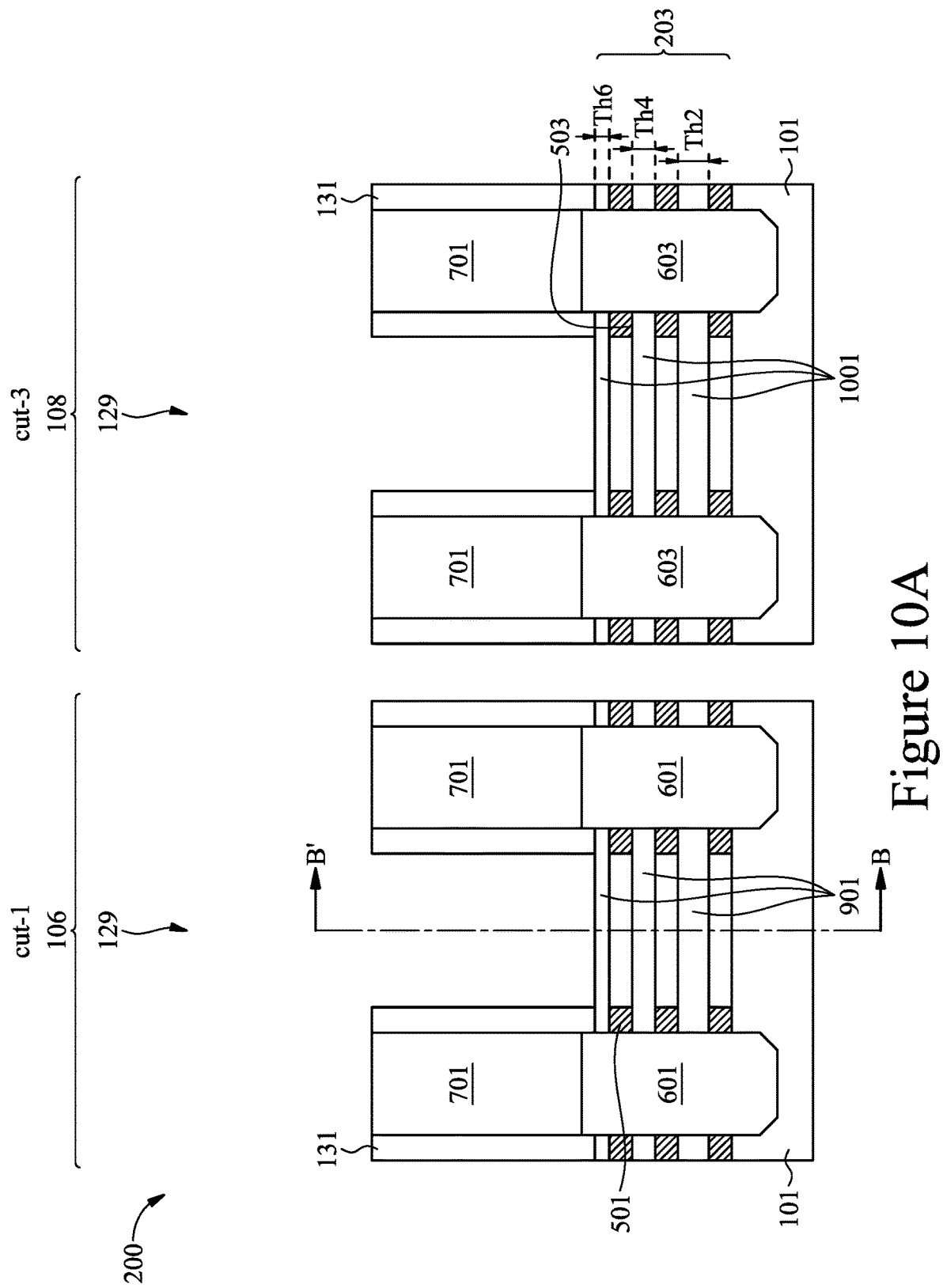

FIG. 10A illustrates that, once the dummy gate dielectric 119 has been exposed, the dummy gate dielectric 119 within the first device region 106 and the second device region 108 may be removed in a wire release process step. The wire release process step may also be referred to as a sheet release process step, a sheet formation process step, a nanosheet formation process step or a wire formation process step. In an embodiment the dummy gate dielectric 119 may be removed using, e.g., a wet etching process, although any suitable etching process may be utilized.

FIG. 10A further shows that, once the dummy gate dielectric 119 has been removed (which also exposes the sides of the first layers 251), the first layers 251 may be removed from between the substrate 101 and from between the second layers 261 within both the first device region 106 and the second device region 108. In an embodiment the first layers 251 may be removed using a wet etching process that selectively removes the material of the first layers 251 (e.g., silicon germanium (SiGe)) without significantly removing the material of the substrate 101 and the material of the second layers 261 (e.g., silicon (Si)). However, any suitable removal process may be utilized.

For example, in an embodiment in which the material of the first layers 251 is silicon germanium (SiGe) and the material of the second layers 261 is silicon, the removal of the first layers 251 may be performed using an etchant that selectively removes the material of the first layers 251 (e.g., silicon germanium) without substantively removing the material of the second layers 261 (e.g., silicon). In an embodiment, the etchant may be a high temperature HCl. Additionally, the wet etching process may be performed at a temperature of between about 400° C. and about 600° C., such as about 560° C., and for a time of between about 100 seconds and about 600 seconds, such as about 300 seconds. However, any suitable etchant, process parameters, and time can be utilized.

By removing the material of the first layers 251, the material of the second layers 261 (e.g., nanosheets) are formed into first nanostructures 901 within the first device region 106 separated from each other by the first inner spacers 501 and formed into second nanostructures 1001 within the second device region 108 separated from each other by the second inner spacers 503. The first nanostructures 901 comprise the channel regions of the first device region 106 that stretch between opposite ones of the first source/drain regions 601 within the first device region 106 and the second nanostructures 1001 comprise the channel regions of the second device region 108 that stretch between opposite ones of the second source/drain regions 603. In an embodiment the first nanostructures 901 and the second nanostructures 1001 are formed to have same or thinner thicknesses as the original thicknesses of the second layers 261, such as having the second thickness Th2, the fourth thickness Th4, the sixth thickness Th6, although the etching processes may also be utilized to reduce the thicknesses.

Additionally, although FIG. 10A illustrates the formation of three of the first nanostructures 901 and three of the second nanostructures 1001, any suitable number of the first nanostructures 901 may be formed from the nanosheets provided in the multi-layer stack 203. For example, the multi-layer stack 203 may be formed to include any suitable number of first layers 251 (e.g., first nanosheets) and any suitable number of second layers 261 (e.g., second nanosheets). As such, a multi-layer stack 203 comprising fewer first layers 251 and fewer second layers 261, after removal of the first layers 251, forms one or two of the first nanostructures 901 and the second nanostructures 1001. Whereas, a multi-layer stack 203 comprising many of the first layers 251 and many of the second layers 261, after removal of the first layers 251, forms four or more of the first nanostructures 901 and the second nanostructures 1001.

Figure 10B:
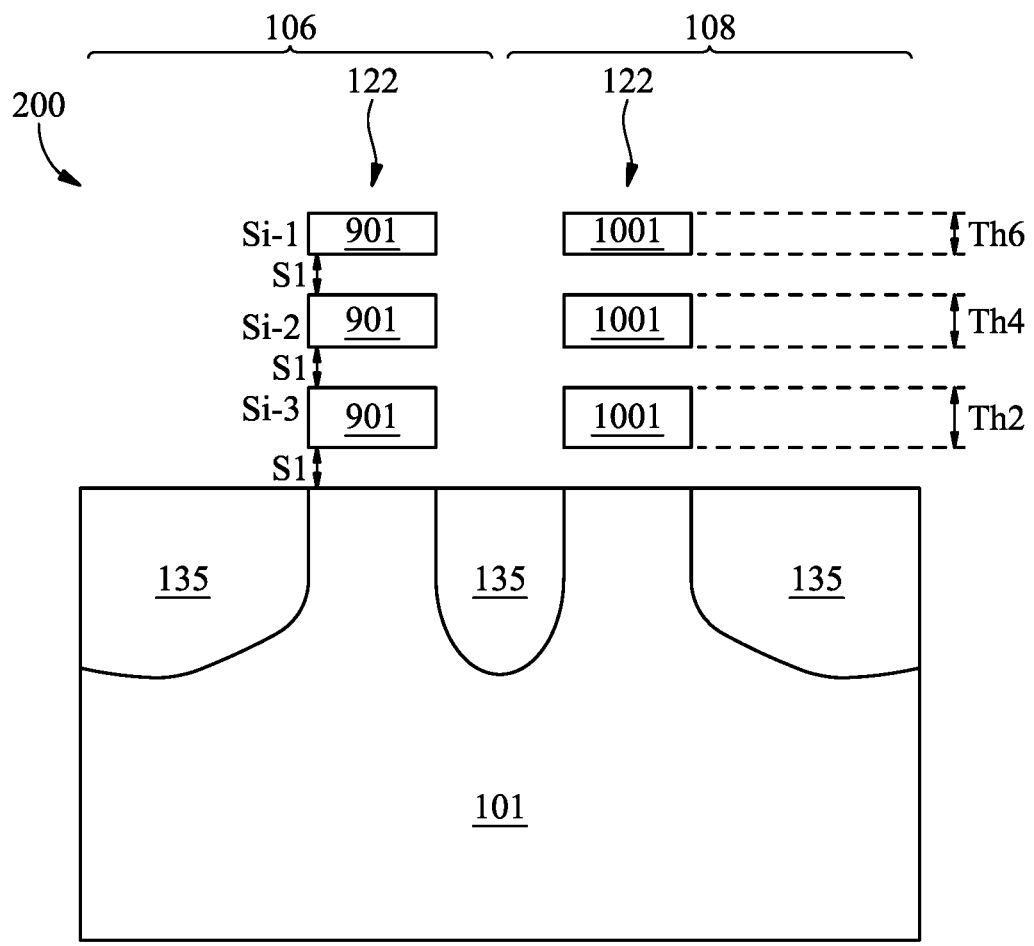

FIG. 10B illustrates a cross-sectional view of the first device region 106 along line B-B' in FIG. 10A and similar to the view of FIG. 3. As can be seen, with the removal of the dummy gate dielectric 119, the sides of the second layers 261 (relabeled within FIG. 10B to the first nanostructures 901) within the first device region 106 are exposed and the sides of the second layers 261 (relabeled within FIG. 10B to the second nanostructures 1001) within the second device region 108 are exposed. As such, the first layers 251 may be exposed to the etchant and removed from between the substrate 101 and the second layers 261 in order to form the first nanostructures 901 in the first device region 106 and the second nanostructures 1001 in the second device region 108.

Figure 11:
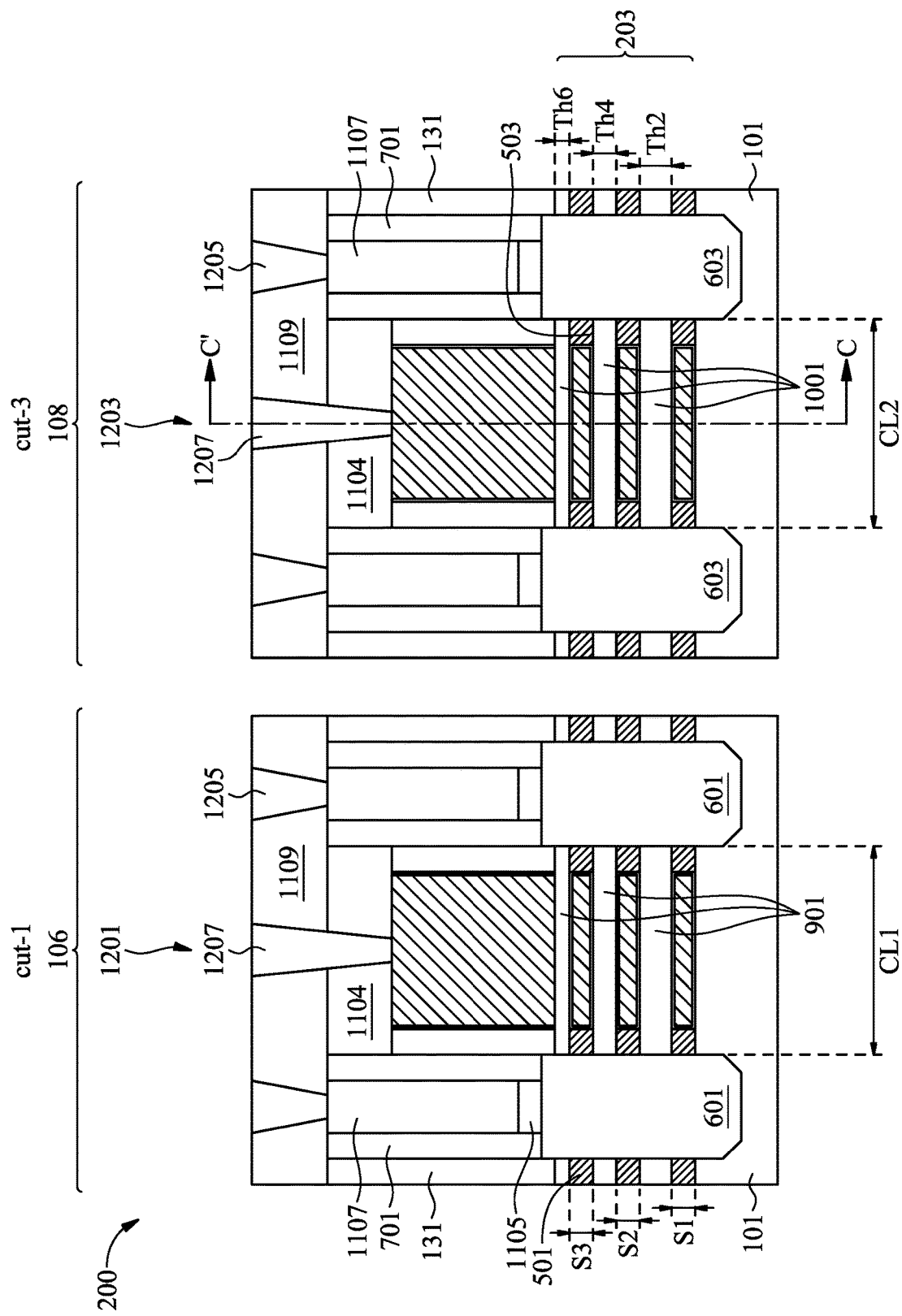

FIG. 11 illustrates the formation of gate stacks which comprise gate dielectrics and gate electrodes. For example, FIG. 11 illustrates formation of a gate dielectric 1101, a first gate electrode 1103, and source/drain contacts 1107 within the first device region 106, in accordance with some embodiments. FIG. 11 further illustrates the formation of the gate dielectric 1101, a second gate electrode 1113, and source/drain contacts 1107 formed within the second device region 108, in accordance with some embodiments.

Once the first nanostructures 901 and the second nanostructures 1001 have been exposed, the gate dielectric 1101 may be formed around the first nanostructures 901 and around the second nanostructures 1001, in accordance with some embodiments. In some embodiments, an optional first interface layer (not separately illustrated) may be formed around the first nanostructures 901 in the first device region 106 and around the second nanostructures 1001 in the second device region 108, prior to the formation of the gate dielectric 1101. In some embodiments, the first interface layer comprises a buffer material such as silicon oxide, although any suitable material may be utilized. The first interface layer may be formed around the first nanostructures 901 in the first device region 106 and the second nanostructures 1001 in the second device region 108 using a process such as CVD, PVD, or even oxidation to a thickness of between about 1 Å and about 20 Å, such as about 9 Å. However, any suitable process or thicknesses may be utilized.

According to some embodiments, the thicknesses for the first nanostructures 901 and the second nanostructures 1001 are thinner than the original thicknesses of the second layers 261 (e.g., Si) by about 0.3 nm and about 2 nm. During the wire release process step and during the formation of the gate dielectric layer 1101, the thicknesses of each of the second layers 261 may experience some Si material loss and/or oxidation. As such, each of the first nanostructures 901 and the second nanostructures 1001 and, hence the channel regions of the first device region 106 and the second device region 108, are formed to a thickness of between about 4 nm and about 8 nm, such as about 6 nm for the bottommost nanostructures and about 5 nm for the topmost nanostructures.

In an embodiment the gate dielectric 1101 is a high-k material such as $HfO_2$, HfSiO, HfSiON, HfTaO, HfTiO, HfZrO, LaO, ZrO, TiO, $Ta_2O_5$, $Al_2O_3$, combinations of these, or the like, deposited through a process such as atomic layer deposition, chemical vapor deposition, or the like. In some embodiments a nitrogen doped dielectric may be initially formed prior to forming the metal content material The gate dielectric 1101 may be deposited to a thickness of between about 1 nm and about 3 nm, although any suitable material and thickness may be utilized. As illustrated, the gate dielectric 1101 wraps around the first nanostructures 901, thus forming channel regions of the first device region 106 and the gate dielectric 1101 wraps around the second nanostructures 1001, thus forming channel regions of the second device region 108.

FIG. 11 further illustrates that the first gate electrode 1103 is formed to surround the first nanostructures 901 within the first device region 106. In an embodiment the first gate electrode 1103 is formed using multiple layers, each layer deposited sequentially adjacent to each other using a highly conformal deposition process such as atomic layer deposition, although any suitable deposition process may be utilized. According to some embodiments, the first gate electrode 1103 may comprise a capping layer, a barrier layer, an n-metal work function layer, a p-metal work function layer, and a fill material.

The capping layer may be formed adjacent to the gate dielectric 1101 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill a remainder of the opening. In an embodiment the fill material may be a material such as tungsten, Al, Cu, AlCu, W, Ti, TiAN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

FIG. 11 further illustrates that the second gate electrode 1113 is formed to surround the second nanostructures 1001 within the second device region 108 and may be formed using multiple layers, each layer deposited sequentially adjacent to each other using a highly conformal deposition process such as atomic layer deposition, although any suitable deposition process may be utilized. In an embodiment the second gate electrode 1113 may be formed using the capping layer, the barrier layer adjacent to the capping layer, the p-metal work function layer adjacent to the barrier layer, the n-metal work function layer adjacent to the p-metal work function layer, and the fill material.

According to some embodiments, one or more of the layers within the first gate electrode 1103 and the second gate electrode 1113 may be formed during a same series of steps. For example, the capping layers and the barrier layers in both of the first gate electrode 1103 and the second gate electrode 1113 may be formed simultaneously, while other layers such as the n-metal work function layer and the p-metal work function layer may be formed and/or patterned independently of each other. Any suitable combination of depositions and removals may be utilized to form the first gate electrode 1103 and the second gate electrode 1113.

Once the openings left behind by the removal of the dummy gate electrode 121 have been filled, the materials of the first gate electrode 1103 and the second gate electrode 1113 may be planarized in order to remove any material that is outside of the openings left behind by the removal of the dummy gate electrode 121. In a particular embodiment the removal may be performed using a planarization process such as chemical mechanical polishing. However, any suitable planarization and removal process may be utilized.

FIG. 11 further illustrates that the gate stack of the gate dielectric 1101 and the first gate electrode 1103 (including any interfacial layers), have a first sheet distance S1 adjacent to the substrate 101, a second sheet distance S2 between a bottommost nanostructure of the first nanostructures 901 and an intermediate nanostructure of the first nanostructures 901, and a third sheet distance S3 between the intermediate nanostructure of the first nanostructures 901 and a topmost nanostructure of the first nanostructures 901. The first sheet distance S1, the second sheet distance S2 and the third sheet distance S3 are equal to the original thicknesses of the first layers 251 such as the first thickness Th1, the third thickness Th3, and the fifth thickness Th5. In embodiments, where the first layers 251 are formed to substantially the same thickness, the first sheet distance S1, the second sheet distance S2 and the third sheet distance S3 are also formed to substantially the same thickness (e.g., S1~S2~S3). In such embodiments, the first sheet distance S1, the second sheet distance S2 and the third sheet distance S3 are formed to substantially a same distance between about 4 nm and about 15 nm, such as about 10 nm. However, any suitable distance may be utilized.

Finally, the first nanostructures 901 and, hence the channels of the NMOS device, and the second nanostructures 1001 and, hence the channels of the PMOS device, are formed from the second layers 261. As such, each of the first nanostructures 901 and the second nanostructures 1001 may have same thicknesses of the original thicknesses of the second layers 261, such as the second thickness Th2, the fourth thickness Th4, and the sixth thickness Th6. As such, the first nanostructures 901 and the second nanostructures 1001 may be formed to thicknesses of between about 4 nm and about 8 nm. Furthermore, a bottommost nanostructure of the first nanostructures 901 and a bottommost nanostructure of the second nanostructures 1001 are formed to the second thickness Th2 and a topmost nanostructure of the first nanostructures 901 and a topmost nanostructure of the second nanostructures 1001 are formed to the sixth thickness Th6. As such, the bottommost nanostructure of the first nanostructures 901 and the second nanostructures 1001 are between about 1.05 times to about 1.3 times thicker than a thickness of the topmost nanostructure of the first nanostructures 901 and the second nanostructures 1001, respectively. However, any suitable dimensions may be utilized.

Additionally, the first nanostructures 901, after formation of the first source/drain regions 601, may have a first channel length CL1 and the second nanostructures 1001, after formation of the second source/drain regions 603, may have a second channel length CL2. In some embodiments, the second channel length CL2 is different from the first channel length CL1, although they may also be the same. According to some embodiments, the first channel length CL1 and the second channel length CL2 are the same length of between about 3 nm and about 30 nm, such as about 12 nm. However, any suitable lengths may be utilized.

According to some embodiments, once the first gate electrode 1103 and the second gate electrode 1113 have been formed, the materials of the first gate electrode 1103, the second gate electrode 1113, and the first spacers 131 may be recessed below the planarized surfaces of the first ILD layer 701. Once recessed, a dielectric capping layer 1104 may be formed within the recesses and then planarized with the first ILD layer 701. In an embodiment the dielectric capping layer 1104 may be a dielectric material such as a silicon nitride layer or a high-k dielectric layer formed using a deposition process such as CVD, ALD, PVD, combinations of these, or the like. Once formed, the dielectric capping layer 1104 may be planarized using a planarization process such as a chemical mechanical polishing process.

FIG. 11 also illustrates that, once the first gate electrode 1103 has been formed, silicide contacts 1105 and source/drain contacts 1107 may be formed through the first ILD layer 701 to make electrical connection to the first source/drain regions 601 in the first device region 106 and the second source/drain regions 603 in the second device region 108. In an embodiment the silicide contacts 1105 and the source/drain contacts 1107 may be formed by initially forming openings through the first ILD layer 701 in order to expose the first source/drain regions 601 in the first device region 106 and the second source/drain regions 603 in the second device region 108. The openings may be formed using, e.g., a suitable photolithographic masking and etching process.

The silicide contacts 1105 may comprise titanium, nickel, cobalt, or erbium in order to reduce the Schottky barrier height of the source/drain contacts 1107. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contacts 1105 may be between about 5 nm and about 50 nm. However, any suitable thickness may be used.

In an embodiment the source/drain contacts 1107 may be a conductive material such as Al, Cu, W, Co, Ti, Ta, Ru, TiN, TiAl, TiAN, TaN, TaC, NiSi, CoSi, combinations of these, or the like, although any suitable material may be deposited into the openings using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP). However, any suitable material and process of formation may be utilized.

Once the source/drain contacts 1107 have been formed, a second ILD layer 1109 may be formed by depositing a dielectric material over the first device region 106 and the second device region 108. The second ILD layer 1109 may be formed and planarized using any of the processes and materials suitable for forming the first ILD layer 701, as set forth above.

Additionally, after formation, source/drain vias 1205 and gate vias 1207 may be formed through the second ILD layer 1109 and the dielectric capping layer 1104 to provide electrical connectivity. In an embodiment the source/drain vias 1205 and the gate vias 1207 may be utilized by initially forming an opening through the second ILD layer 1109 and the dielectric capping layer 1104 using, e.g., a masking and etching process. Once the openings have been formed, conductive material, such as copper, may be deposited to fill and/or overfill the openings using a deposition process such as plating, chemical vapor deposition, sputtering, combinations of these, or the like. Excess material may then be removed using, for example, a planarization process such as chemical mechanical planarization, or the like.

By forming and utilizing the first nanostructures 901 within the first device region 106 and the second nanostructures 1001 within the second device region 108, high performance may be achieved with short channel devices. For example, according to some embodiments, a GAA device structure comprising multiple channel thicknesses, allows for a topmost channel (e.g., channel closest to a gate top or closest to a gate contact) in the GAA device to face extra source/drain dopant implant induced short channel effects. For example, a thinner sheet can provide better gate control to minimize or prevent the lateral diffusion induced short channel effects of a source/drain dopant implant. Furthermore, the multiple channel thicknesses within a multiple thickness sheet device structure also allows for On-current ($I_{ON}$) and drain induced barrier loading (DIBL) modification to be performed through the device structure. In addition, the extra source/drain implant doping combined with deeper source/drain regions provides more volume to allow enhanced source/drain strain effects to be performed. As such, a GAA device with improved ion performance as well as increased connection margin for the source/drain to bottom sheet ends is achieved.

Figure 12A:
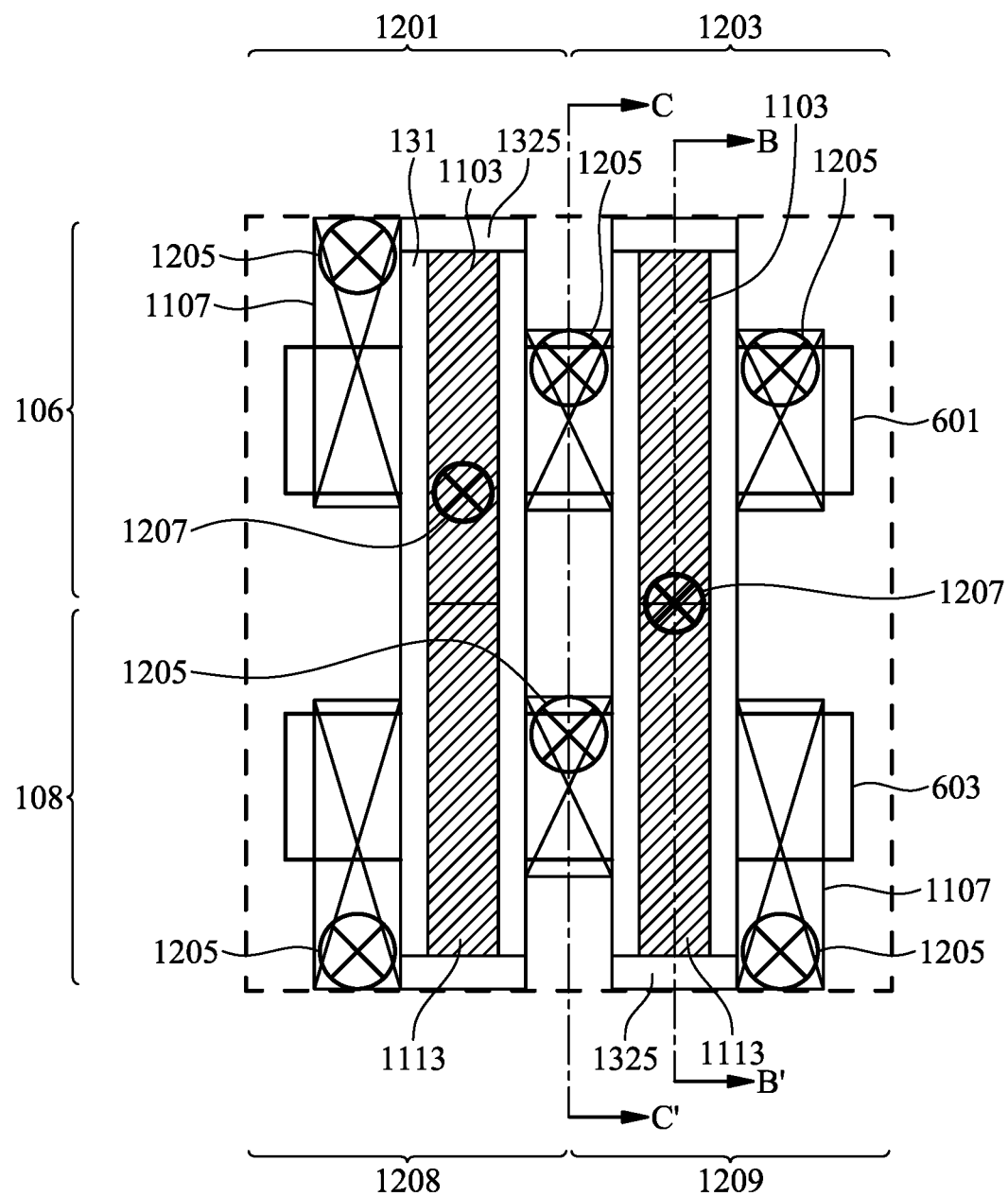
FIG. 12A illustrates a physical layout of the semiconductor device comprising a set of GAA transistors, in accordance with some embodiments.

FIG. 12A illustrates a top down view of one embodiment of NMOS gate all around transistors formed together with PMOS gate all around transistors. In an embodiment the first device region 106 is utilized to form a first NMOS gate all around transistor 1201 and a second NMOS gate all around transistor 1203. Both the first NMOS gate all around transistor 1201 and the second NMOS gate all around transistor 1203 utilize the same combination of the first nanostructures 901 and first source/drain regions 601, with multiple ones of the first gate electrode 1103 formed over the same combination of the first nanostructures 901 and the first source/drain regions 601. In these views, however, the first nanostructures 901 are covered by the first gate electrode 1103, so the first nanostructures 901 are not visible. Gate end dielectrics 1325 are formed at the ends of the first gate electrodes 1103 and the first spacers 131. Additionally, the source/drain contacts 1107 are formed to make electrical connection with each of the first source/drain regions 601 within the first device region 106 and source/drain vias 1205 and gate vias 1207 are formed to provide electrical connectivity.

Within the second device region 108, a first PMOS gate all around transistor 1208 and a second PMOS gate all around transistor 1209 are formed. Both the first PMOS gate all around transistor 1208 and the second PMOS gate all around transistor 1209 utilize the same combination of the second nanostructures 1001 and second source/drain regions 603, with multiple ones of the second gate electrodes 1113 formed over the same combination of the second nanostructures 1001 and the second source/drain regions 603. In these views, however, the second nanostructures 1001 are covered by the second gate electrodes 1113, so the second nanostructures 1001 are not visible. Gate end dielectrics 1325 are formed at the ends of the second gate electrodes 1113 and the first spacers 131. Additionally, the source/drain contacts 1107 are formed to make electrical connection with each of the second source/drain regions 603 within the second device region 108 and the source/drain vias 1205 and the gate vias 1207 are formed to provide electrical connectivity.

Figure 12B:
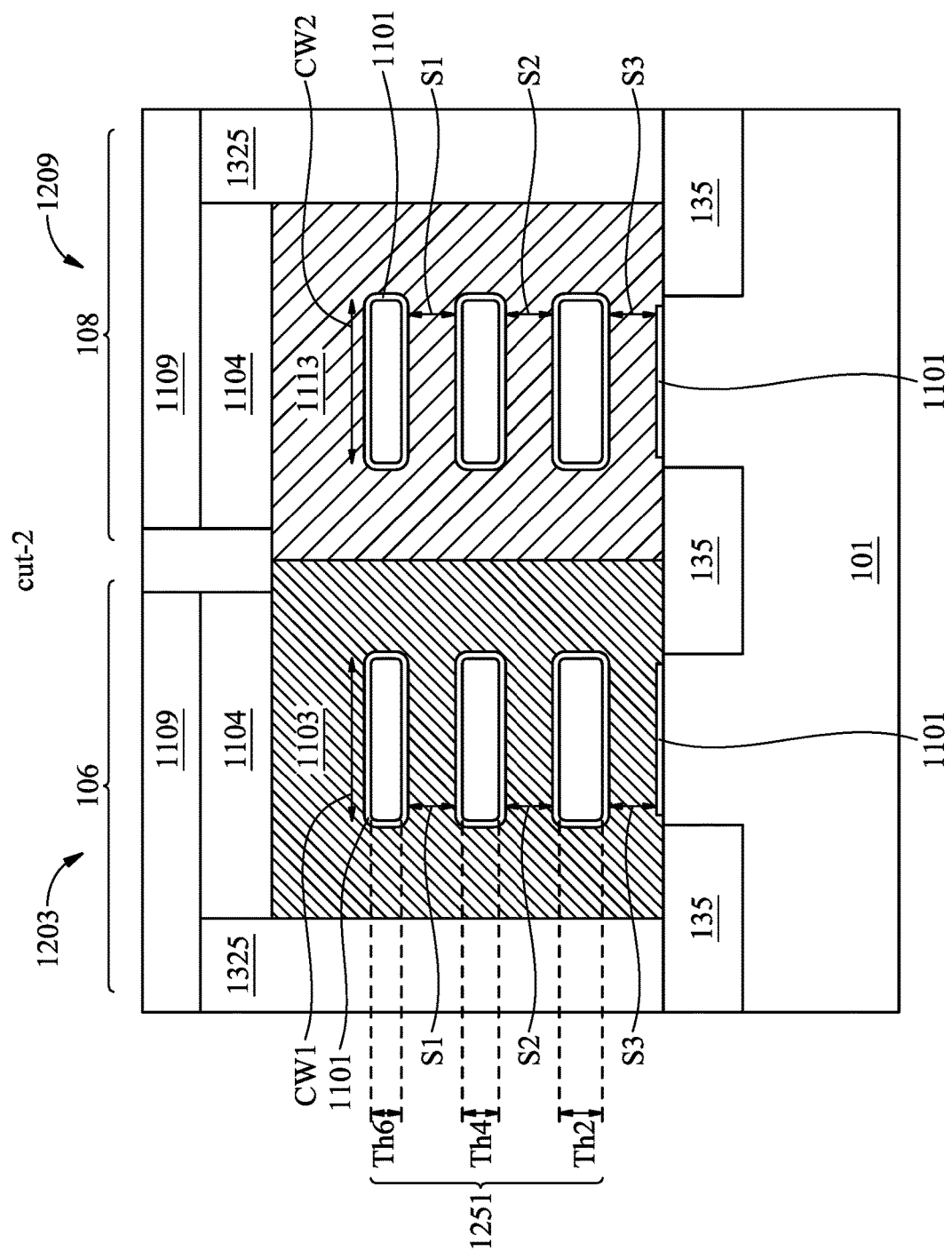
FIGS. 12B and 12C illustrate cross-sectional views through a set of the GAA transistors in the semiconductor device of FIG. 12A, the set of GAA transistors being arranged as a CMOS device, in accordance with some embodiments.

FIG. 12B illustrates the cross-sectional view taken through line B-B' of FIG. 12A, in accordance with some embodiments. As illustrated, the first gate electrode 1103 of the second NMOS gate all around transistor 1203 is formed adjacent to the second gate electrode 1113 of the second PMOS gate all around transistor 1209. Furthermore, the first nanostructures 901 provide a first vertical stack of channels 1251 of the second NMOS gate all around transistor 1203 and a second vertical stack of channels 1253 of the second PMOS gate all around transistor 1209. As such, thicknesses of the channels of the first vertical stack of channels 1251 and thicknesses of the channels of the second vertical stack of channels 1253 are substantially equal to the thicknesses of the second layers 261 (Th6, Th4, and Th2), respectively. Furthermore, the sheet spacing (e.g., S1, S2, and S3) are substantially equal to the thicknesses of the first layers 251 (e.g., Th1, Th3, and Th5). Additionally, a single gate via of the gate vias 1207 is utilized to electrically connect both the first gate electrode 1103 and the second gate electrode 1113.

FIG. 12B further illustrates that the first nanostructures 901 are formed to have a first channel width CW1 and the second nanostructures 1001 are formed to have a second channel width CW2. The first channel width CW1 and the second channel width CW2 may be formed to a same width, or they may be formed to have different widths depending on the desired device characteristics of the second NMOS gate all around transistor 1203 and the second PMOS gate all around transistor 1209. According to some embodiments, the first channel width CW1 and the second channel width CW2 are formed to be approximately a same width of between about 3 nm and about 70 nm, such as about 30 nm. However, any suitable widths may be used.

Figure 12C:
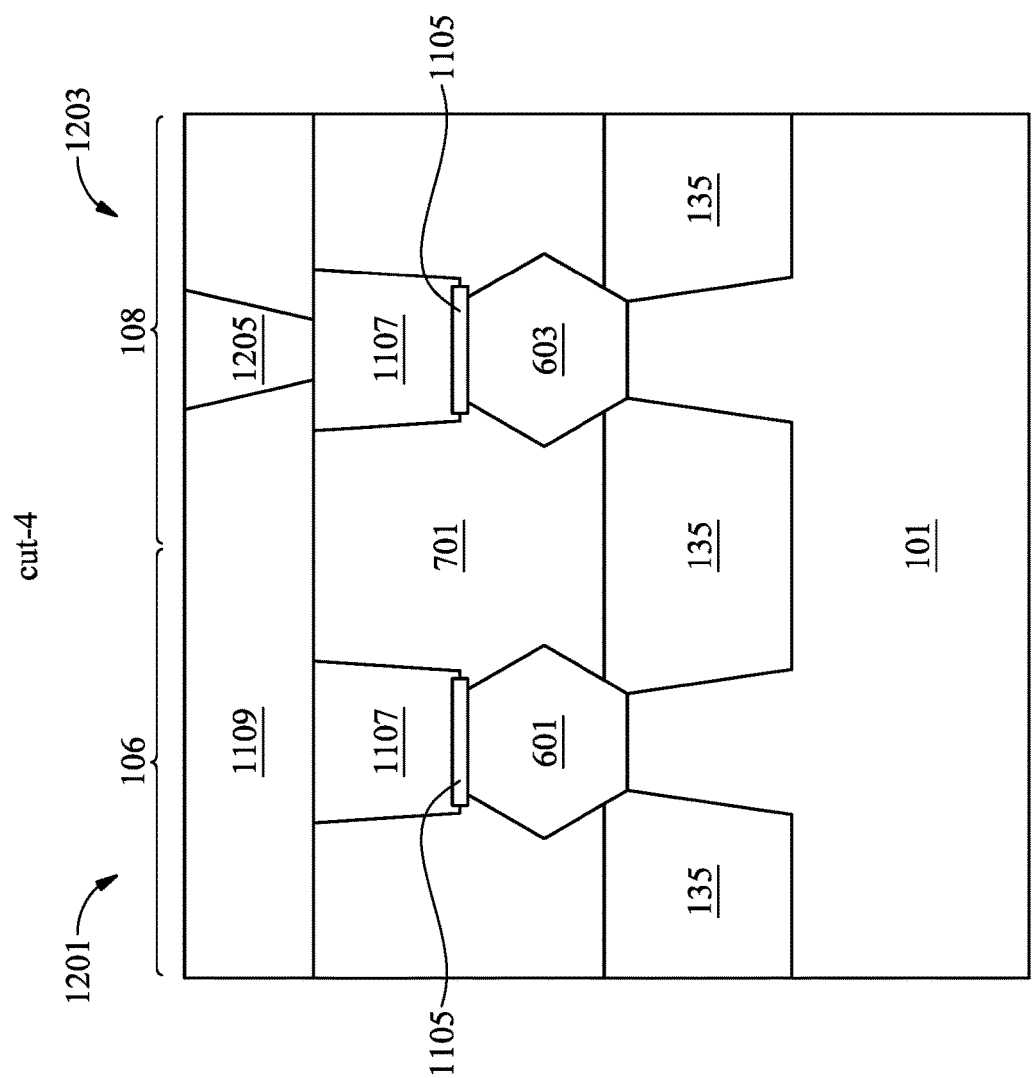

FIG. 12C illustrates the cross-sectional view taken through line C-C' of FIG. 12A, in accordance with some embodiments. As illustrated, the first source/drain region 601 of the second NMOS gate all around transistor 1203 is formed adjacent to the second source/drain region 603 of the second PMOS gate all around transistor 1209. Furthermore, the first source/drain regions 601 and the second source/drain region 603 are illustrated with facet limited surfaces of the epitaxially grown materials formed over the substrate 101 and between sidewalls of the first isolation regions 135. The first ILD layer 701 is then formed over the first source/drain region 601 of the second NMOS gate all around transistor 1203 and over the second source/drain region 603 of the second PMOS gate all around transistor 1209. Openings may be formed in the first ILD layer 701 to expose surfaces of the first source/drain region 601 and the second source/drain region 603. The silicide contacts 1105 may be formed through the openings in the first ILD layer 701 and over the exposed surfaces of the first source/drain regions 601 and the second source/drain region 603. The source/drain contacts 1107 may be deposited over the silicide contacts 1105 and fill a remainder of the openings in the first ILD layer 701 and then planarized with a surface of the first ILD layer 701. The second ILD layer 1109 is then deposited over the planar surfaces of the source/drain contacts 1107 and the first ILD layer 701. The source/drain vias 1205 are then formed through the second ILD layer 1109 to electrically connect the to the source/drain contacts 1107.

The embodiments disclosed herein relate to semiconductor devices and their manufacturing methods, and more particularly to semiconductor devices comprising a transistor having gate all around (GAA) transistor structures and manufacturing methods thereof. According to some embodiments, different thickness in an epi-growth scheme is adopted to create different sheet thicknesses within the same device channel regions for use in manufacturing vertically stacked nanosheet (or nanowire) GAA devices. A vertically stacked nanosheet (or nanowire) GAA device may be formed with a topmost channel region that is thinner than a bottommost channel region. As such, the topmost channel region of the GAA device may comprise lightly doped drain regions with a highest concentration and/or a greater degree of lateral diffusion of implanted dopants as compared to the bottommost channel region allowing for better gate control to minimize or prevent the lateral diffusion induced short channel effects of a source/drain dopant implant.

Furthermore, the present embodiments provide one or more advantages: a GAA device structure comprising multiple channel thicknesses allows for a top channel (e.g., channel closest to a gate top or closest to a gate contact) to face extra source/drain dopant implant induced short channel effects. For example, a thinner sheet can provide better gate control to minimize or prevent the lateral diffusion induced short channel effects of a source/drain dopant implant. Furthermore, the multiple channel thicknesses within a multiple thickness sheet device structure allows for On-current ($I_{ON}$) and drain induced barrier loading (DIBL) modification to be performed through the device structure. In addition, the extra source/drain implant doping combined with deeper source/drain regions provides more volume to allow enhanced source/drain strain effects to be performed. As such, improved ION performance as well as increased connection margin for the source/drain to bottom sheet ends.

In an embodiment, a method includes: depositing a first layer of a first semiconductor material over a semiconductor substrate; depositing a first layer of a second semiconductor material over the first layer of the first semiconductor material to a first thickness, the second semiconductor material being different from the first semiconductor material; depositing a second layer of the first semiconductor material over the first layer of the second semiconductor material; depositing a second layer of the second semiconductor material over the second layer of the first semiconductor material to a second thickness less than the first thickness; patterning the first layer of the first semiconductor material, the first layer of the second semiconductor material, the second layer of the first semiconductor material, and the second layer of the second semiconductor material into a fin; removing the first semiconductor material to form a first nanostructure from the first layer of the second semiconductor material and a second nanostructure from the second layer of the second semiconductor material, the first nanostructure having a first height and the second nanostructure having a second height that is less than the first height; depositing a gate dielectric layer to surround the first nanostructure and the second nanostructure; and depositing a gate electrode around the gate dielectric layer. In an embodiment, the first thickness is between about 1.05 times to about 1.3 times the second thickness. In an embodiment, the method further includes: etching a first opening in the fin; epitaxially growing a first source/drain region in the first opening; and doping the first source/drain region after the epitaxially growing. In an embodiment, the first source/drain region extends into the semiconductor substrate at least 3 nm. In an embodiment, the method further includes: annealing the first source/drain region to form a first lightly doped drain region in the first nanostructure and a second lightly doped drain region in the second nanostructure, a dopant concentration of the second lightly doped drain region being greater than a dopant concentration of the first lightly doped drain region. In an embodiment, the method further includes: annealing the first source/drain region to form a first lightly doped drain region in the first nanostructure and a second lightly doped drain region in the second nanostructure, a width of the second lightly doped drain region being greater than a width of the first lightly doped drain region. In an embodiment, the first layer has a first thickness and the second layer has the first thickness.

In another embodiment, a method includes: etching an opening through a multilayer stack to expose a semiconductor substrate; epitaxially growing a source/drain region in the opening, the source/drain region including a first interface with a first layer of the multilayer stack and a second interface with a second layer of the multilayer stack, the first layer having a greater thickness than the second layer; implanting dopants in the source/drain region after the epitaxially growing the source/drain region; removing a semiconductor material of the multilayer stack from between the first layer and the semiconductor substrate to form a first nanostructure having a first height; removing the semiconductor material of the multilayer stack from between the second layer and the first layer to form a second nanostructure having a second height, the second height being less than the first height; depositing a gate dielectric layer to surround the first nanostructure and the second nanostructure; and depositing a gate electrode around the gate dielectric layer. In an embodiment of the method, a thickness of the first layer is between about 1.05 times to about 1.3 times a thickness of the second layer. In an embodiment, the etching the opening includes etching into the semiconductor substrate to a depth of at least 3 nm. In an embodiment, the method further includes: forming a first lightly doped drain region in the first layer, the first lightly doped drain region including a first dopant concentration; and forming a second lightly doped drain region in the second layer, the second lightly doped drain region including a second dopant concentration, the second dopant concentration being greater than the first dopant concentration. In an embodiment, the method further includes: forming a first lightly doped drain region with a first width in the first layer; and forming a second lightly doped drain region with a second width in the second layer, the second width being larger than the first width. In an embodiment, the removing the semiconductor material of the multilayer stack from between the first layer and the semiconductor substrate forms a first opening with a first thickness and the removing the semiconductor material of the multilayer stack from between the second layer and the first layer forms a second opening with the first thickness. In an embodiment, the method further includes: forming spacers between the first layer of the multilayer stack and the second layer of the multilayer stack prior to the epitaxially growing the source/drain region.

In yet another embodiment, a semiconductor device, includes: a vertical stack of nanostructures, wherein a first thickness of a bottommost nanostructure of the vertical stack of nanostructures is greater than a second thickness of a topmost nanostructure of the vertical stack of nanostructures; a gate electrode surrounding each nanostructure within the vertical stack of nanostructures; and a gate dielectric between the gate electrode and each nanostructure within the vertical stack of nanostructures. In an embodiment of the semiconductor device, the first thickness is between about 1.05 times to about 1.3 times the second thickness. In an embodiment, the semiconductor device further includes: a source/drain region, wherein the source/drain region extends at least 3 nm into the substrate. In an embodiment, the source/drain region includes a first interface with the bottommost nanostructure and a second interface with the topmost nanostructure, and wherein the bottommost nanostructure includes a first lightly doped region with a first dopant concentration at the first interface and the bottommost nanostructure includes a second lightly doped region with a second dopant concentration at the second interface, the second dopant concentration being greater than the first dopant concentration. In an embodiment, the first lightly doped region includes a first degree of dopant diffusion from the first interface and the second lightly doped region includes a second degree of dopant diffusion from the second interface, the second degree of dopant diffusion being greater than the first degree of dopant diffusion. In an embodiment, the semiconductor device further includes an intermediate nanostructure within the vertical stack of nanostructures, the intermediate nanostructure having a third thickness between the first thickness and the second thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a first layer of a first semiconductor material over a semiconductor substrate;
    depositing a first layer of a second semiconductor material over the first layer of the first semiconductor material to a first thickness, the second semiconductor material being different from the first semiconductor material;
    depositing a second layer of the first semiconductor material over the first layer of the second semiconductor material;
    depositing a second layer of the second semiconductor material over the second layer of the first semiconductor material to a second thickness less than the first thickness;
    patterning the first layer of the first semiconductor material, the first layer of the second semiconductor material, the second layer of the first semiconductor material, and the second layer of the second semiconductor material into a fin;
    after the patterning, forming horizontal recesses in the first and second layer of the first semiconductor material;
    forming inner spacers in the horizontal recesses, wherein the inner spacers are in direct physical contact with the second semiconductor material;
    removing the first semiconductor material to form a first nanostructure from the first layer of the second semiconductor material and a second nanostructure from the second layer of the second semiconductor material, the first nanostructure having a first height and the second nanostructure having a second height that is less than the first height;
    depositing a gate dielectric layer to surround the first nanostructure and the second nanostructure; and
    depositing a gate electrode around the gate dielectric layer.

2. The method of claim 1, wherein the first thickness is between about 1.05 times to about 1.3 times the second thickness.

3. The method of claim 2, further comprising:
    etching a first opening in the fin;
    epitaxially growing a first source/drain region in the first opening; and
    doping the first source/drain region after the epitaxially growing.

4. The method of claim 3, wherein the first source/drain region extends into the semiconductor substrate at least 3 nm.

5. The method of claim 3, further comprising annealing the first source/drain region to form a first lightly doped drain region in the first nanostructure and a second lightly doped drain region in the second nanostructure, a dopant concentration of the second lightly doped drain region being greater than a dopant concentration of the first lightly doped drain region.

6. The method of claim 3, further comprising annealing the first source/drain region to form a first lightly doped drain region in the first nanostructure and a second lightly doped drain region in the second nanostructure, a width of the second lightly doped drain region being greater than a width of the first lightly doped drain region.

7. The method of claim 1, wherein the first layer has a first thickness and the second layer has the first thickness.

8. A method comprising:
    etching an opening through a multilayer stack to expose a semiconductor substrate;
    epitaxially growing a source/drain region in the opening, the source/drain region comprising a first interface with a first layer of the multilayer stack and a second interface with a second layer of the multilayer stack, the first layer having a greater thickness than the second layer;
    implanting dopants in the source/drain region after the epitaxially growing the source/drain region;

removing a semiconductor material of the multilayer stack from between the first layer and the semiconductor substrate to form a first nanostructure having a first height;

removing the semiconductor material of the multilayer stack from between the second layer and the first layer to form a second nanostructure having a second height, the second height being less than the first height, wherein the removing the semiconductor material of the multilayer stack from between the first layer and the semiconductor substrate forms a first opening with a first thickness and wherein the removing the semiconductor material of the multilayer stack from between the second layer and the first layer forms a second opening with the first thickness;

depositing a gate dielectric layer to surround the first nanostructure and the second nanostructure; and depositing a gate electrode around the gate dielectric layer.

9. The method of claim 8, wherein a thickness of the first layer is between about 1.05 times to about 1.3 times a thickness of the second layer.

10. The method of claim 8, wherein the etching the opening comprises etching into the semiconductor substrate to a depth of at least 3 nm.

11. The method of claim 8, further comprising:
forming a first lightly doped drain region in the first layer, the first lightly doped drain region comprising a first dopant concentration; and
forming a second lightly doped drain region in the second layer, the second lightly doped drain region comprising a second dopant concentration, the second dopant concentration being greater than the first dopant concentration.

12. The method of claim 11, further comprising:
forming a first lightly doped drain region with a first width in the first layer; and
forming a second lightly doped drain region with a second width in the second layer, the second width being larger than the first width.

13. The method of claim 8, further comprising forming spacers between the first layer of the multilayer stack and the second layer of the multilayer stack prior to the epitaxially growing the source/drain region.

14. A semiconductor device, comprising:
a source/drain region, wherein the source/drain region extends at least 3 nm into a substrate;
a vertical stack of nanostructures, wherein a first thickness of a bottommost nanostructure of the vertical stack of nanostructures is greater than a second thickness of a topmost nanostructure of the vertical stack of nanostructures, wherein the source/drain region comprises a first interface with the bottommost nanostructure and a second interface with the topmost nanostructure, and wherein the bottommost nanostructure comprises a first lightly doped region with a first dopant concentration at the first interface and the bottommost nanostructure comprises a second lightly doped region with a second dopant concentration at the second interface, the second dopant concentration being greater than the first dopant concentration;
a gate electrode surrounding each nanostructure within the vertical stack of nanostructures; and
a gate dielectric between the gate electrode and each nanostructure within the vertical stack of nanostructures.

15. The semiconductor device of claim 14, wherein the first thickness is between about 1.05 times to about 1.3 times the second thickness.

16. The semiconductor device of claim 14, wherein the first lightly doped region comprises a first degree of dopant diffusion from the first interface and the second lightly doped region comprises a second degree of dopant diffusion from the second interface, the second degree of dopant diffusion being greater than the first degree of dopant diffusion.

17. The semiconductor device of claim 14, further comprising an intermediate nanostructure within the vertical stack of nanostructures, the intermediate nanostructure having a third thickness between the first thickness and the second thickness.

18. The method of claim 8, wherein the first thickness is between about 4 nm and about 15 nm.

19. The semiconductor device of claim 14, further comprising a physical spacer between the bottommost nanostructure and the topmost nanostructure.

20. The semiconductor device of claim 19, wherein the physical spacer has a third thickness between about 4 nm and about 15 nm.

* * * * *